United States Patent
Cariello et al.

(10) Patent No.: US 11,276,461 B1
(45) Date of Patent: Mar. 15, 2022

(54) PROGRAMMING MULTI-LEVEL MEMORY CELLS

(71) Applicant: Micron Technology, Inc., Boise, ID (US)

(72) Inventors: Giuseppe Cariello, Boise, ID (US);
Jonathan W. Oh, Boise, ID (US);
Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/108,897

(22) Filed: Dec. 1, 2020

(51) Int. Cl.
*G11C 16/04* (2006.01)
*G11C 11/56* (2006.01)

(52) U.S. Cl.
CPC ...... *G11C 11/5671* (2013.01); *G11C 11/5628* (2013.01); *G11C 11/5642* (2013.01); *G11C 16/0483* (2013.01)

(58) Field of Classification Search
CPC .................................................. G11C 11/5628
USPC ..................................................... 365/185.28
See application file for complete search history.

(56) References Cited

U.S. PATENT DOCUMENTS

2014/0334228 A1* 11/2014 Kim ............... G11C 29/52
365/185.03

\* cited by examiner

*Primary Examiner* — Hoai V Ho
(74) *Attorney, Agent, or Firm* — Holland & Hart LLP

(57) ABSTRACT

Methods, systems, and devices for programming multi-level memory cells are described. After a first pass, an offset in the form of one or more offset pulses, may be applied to MLCs that are in a state of a higher level. The offset may be applied before or during a first part of a second pass. The offset may move the signals of the cells before the cells are finally programmed so as to avoid potential overlaps between the unprogrammed cells and cells that are programmed to the lower half of the final levels during the second pass. The offset cells may then be further moved to the other levels in the higher half of the final levels.

22 Claims, 12 Drawing Sheets

US 11,276,461 B1

PROGRAMMING MULTI-LEVEL MEMORY CELLS

FIELD OF TECHNOLOGY

The following relates generally to one or more systems for memory and more specifically to programming multi-level memory cells.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

A memory with multi-level cells (MLCs) may have different levels programmed in different passes associated with different data or pages. A first pass may be used to program a first page and a second pass may be used to program further pages, superposing the data of the further pages upon the first page data. The first page may also be referred to as a lower page (LP). Under certain conditions, it may be possible that during the second pass, some of the states of programming for bits that were the lower level for the first pass may overlap with a state of the higher level of the first pass. When programming of the memory cells may be interrupted during the second pass (e.g., during an unexpected power outage), the data for the second page may be recoverable because it may be maintained in the source for the programming. However, the lower page may be lost because the only location it may be stored may be in the memory being programmed, especially if the lower page may have been programmed in the distant past. Thus, maintaining lower page immunity may be an important feature for MLCs in multi-pass programming schemes.

According to various aspects described herein, after the first pass, an offset in the form of one or more offset pulses, may be applied to the MLCs that are in a higher level after the first pass. The offset may be applied before or during a first part of the second pass. The offset may move the signals of the cells before the cells are finally programmed so as to avoid potential overlaps between the unprogrammed cells and cells that are programmed to the lower portion (e.g., half) of the final levels during the second pass. The offset cells may then be further moved to the other levels in the higher portion (e.g., upper half) of the final levels (e.g., with additional programming pulses of the second pass).

Features of the disclosure are initially described in the context of systems, devices, circuits, flow charts, and distribution plots as described with reference to FIGS. 1 through 11. These and other features of the disclosure are further illustrated by and described with reference to an apparatus diagram and flowcharts that relate to programming multi-level memory cells as described with reference to FIGS. 12-14.

Figure 1:
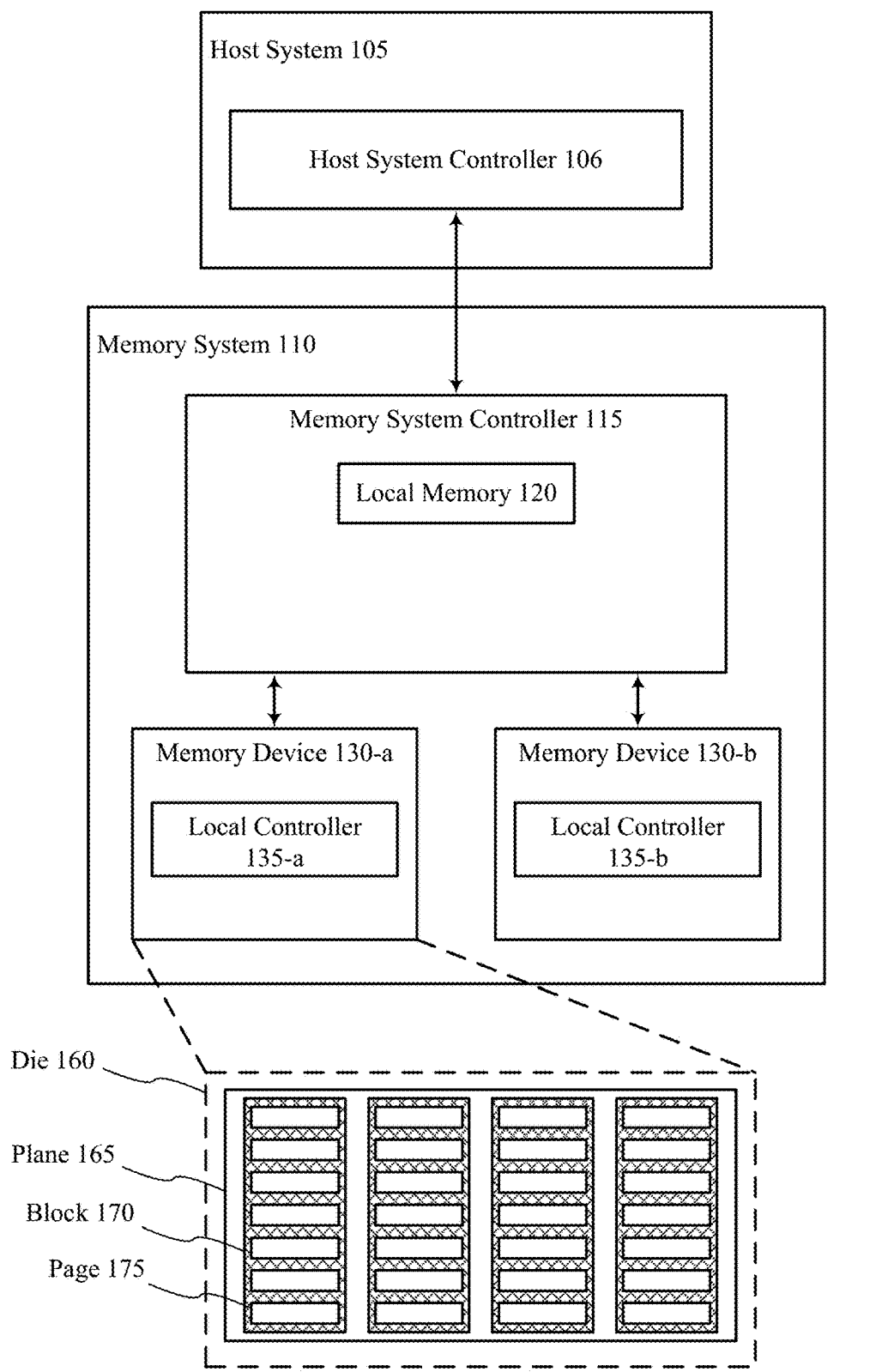
FIG. 1 illustrates an example of a system that supports programming multi-level memory cells in accordance with examples as disclosed herein.

FIG. 1 is an example of a system 100 that supports programming multi-level memory cells in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

Memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, where memory system 110 includes more than one memory device 130, different memory devices 130 within memory system 110 may include the same or different types of memory cells.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130, and other such operations, which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. And in some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 when read from or written to a memory device 130, and may be available within the local memory 120 for subsequent retrieval for or manipulation (e.g., updating) by the host system 105 (e.g., with reduced latency relative to a memory device 130) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM). Additionally or alternatively, a memory device 130 may include one or more arrays of volatile memory cells. For example, a memory device 130 may include random access memory (RAM) memory cells, such as dynamic RAM (DRAM) memory cells and synchronous DRAM (SDRAM) memory cells.

In some examples, a memory device 130 may include (e.g., on a same die or within a same package) a local controller 135, respectively, which may execute operations on one or more memory cells of the memory device 130. A local controller 135 may operate in conjunction with a memory system controller 115 or may perform one or more functions ascribed herein to the memory system controller 115.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support programming multi-level memory cells. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, when executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

Figure 2:
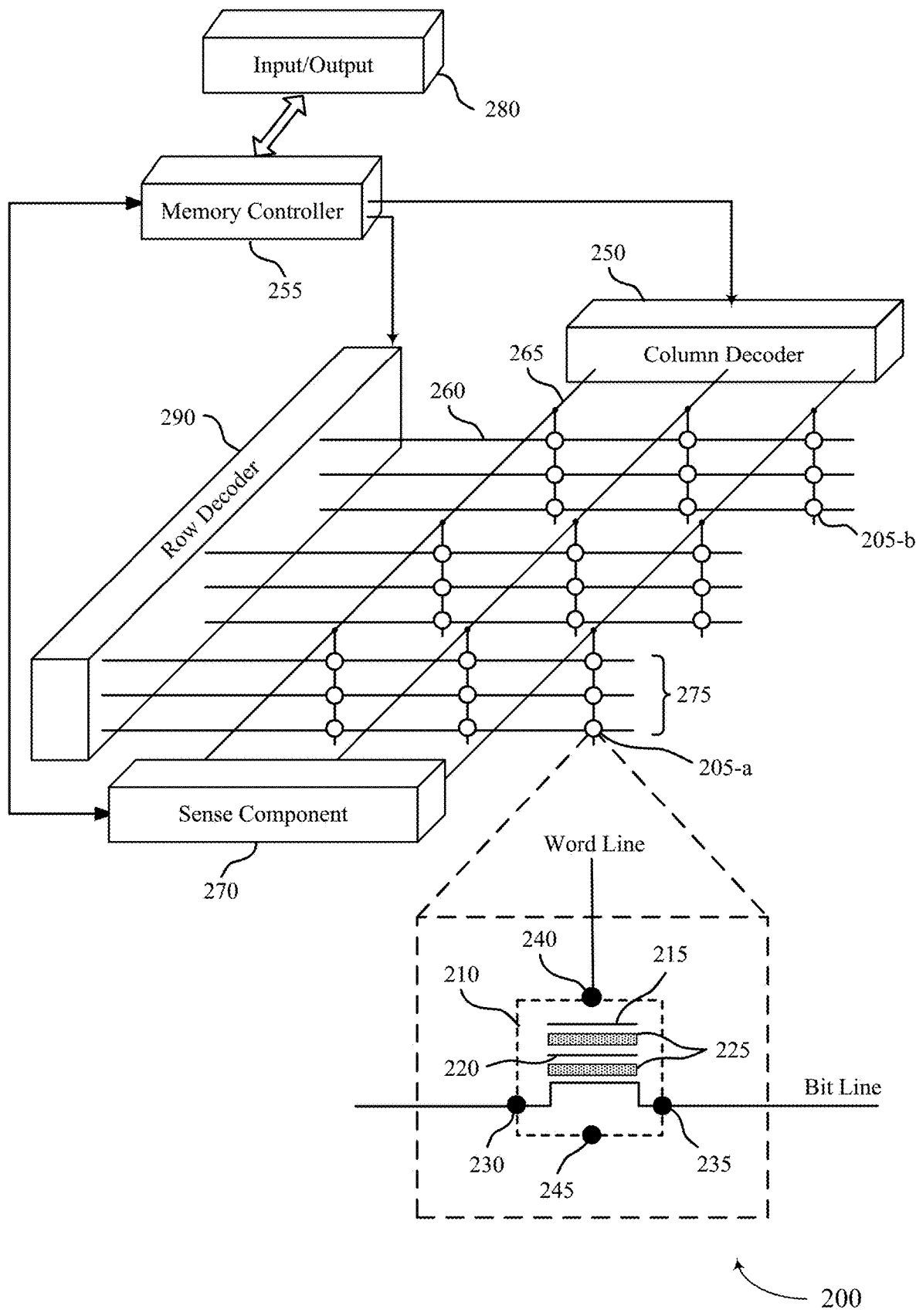
FIG. 2 illustrates an example of a memory device that supports programming multi-level memory cells in accordance with examples as disclosed herein.

FIG. 2 illustrates an example of a memory device 200 that supports programming multi-level memory cells in accordance with examples as disclosed herein. In some cases, the memory device 200 may be an example of a memory device 130 as described with reference to FIG. 1. FIG. 2 is an illustrative representation of various components and features of the memory device 200. As such, it should be appreciated that the components and features of the memory device 200 are shown to illustrate functional interrelationships, and not necessarily actual physical positions within the memory device 200. Further, although some elements included in FIG. 2 are labeled with a numeric indicator, some other corresponding elements are not labeled, even though they are the same or would be understood to be similar, in an effort to increase visibility and clarity of the depicted features.

The memory device 200 may include one or more memory cells, such as memory cell 205-a and memory cell 205-b. A memory cell 205 may be, for example, a flash or other type of NAND memory cell, such as in the blow-up diagram of memory cell 205-a.

Each memory cell 205 may be programmed to store a logic value representing one or more bits of information. In some cases, a single memory cell 205—such as an SLC memory cell 205—may be programmed to one of two supported states and thus may store one bit of information at a time (e.g., a logic 0 or a logic 1). In other cases, a single memory cell 205—such as an MLC, TLC, QLC, or other type of multiple-level memory cell 205—may be programmed to one of more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 205 may be programmed to one of sixteen supported states and thus may store four bits of information at a time corresponding to one of sixteen logic values (e.g., 0000, 0001, . . . 1111).

In some cases, a multiple-level memory cell 205 (e.g., an MLC memory cell, a TLC memory cell, a QLC memory cell) may be physically different than an SLC cell. For example, a multiple-level memory cell 205 may use a different cell geometry or may be fabricated using different materials. In some cases, a multiple-level memory cell 205 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

Different types of memory cells 205 may store information in different ways. In a DRAM memory array, for example, each memory cell 205 may include a capacitor that includes a dielectric material (e.g., an insulator) to store a charge representative of a programmable state and thus the stored information. In an FeRAM memory array, as another example, each memory cell 205 may include a capacitor that includes a ferroelectric material to store a charge or a polarization representative of a programmable state and thus the stored information.

In some NAND memory arrays (e.g., flash arrays), each memory cell 205 may include a transistor that has a charge trapping structure (e.g., a floating gate, a replacement gate, or a dielectric material) for storing an amount of charge representative of the logic value. For example, the blow-up in FIG. 2 illustrates a NAND memory cell 205-a that includes a transistor 210 (e.g., a metal-oxide-semiconductor (MOS) transistor) that may be used to store a logic value. The transistor 210 has a control gate 215 and may also include a charge trapping structure 220 (e.g., a floating gate or a replacement gate), where the charge trapping structure 220 is sandwiched between two portions of dielectric material 225. Transistor 210 includes a first node 230 (e.g., a source or drain) and a second node 235 (e.g., a drain or source). A logic value may be stored in transistor 210 by placing (e.g., writing, storing) a quantity of electrons (e.g., an amount of charge) on charge trapping structure 220. The amount of charge to be stored on the charge trapping structure 220 may depend on the logic value to be stored. The charge stored on charge trapping structure 220 may affect the threshold voltage of transistor 210, thereby affecting the amount of current that flows through transistor 210 when transistor 210 is activated (e.g., when a voltage is applied to the control gate 215). In some examples, the charge trapping structure 220 may be an example of a floating gate that may be part of a 3D NAND structure. For example, a 3D NAND may have multiple floating gates arranged around a single channel (e.g., horizontal or vertical channel). Other structures may also be used for a 3D NAND, including the use of replacement gate technology in the place of floating gate.

A logic value stored in transistor 210 may be sensed (e.g., as part of a read operation) by applying a voltage to the control gate 215 (e.g., to control node 240, via the word line 260) to activate transistor 210 and measuring (e.g., detecting, sensing) the resulting amount of current that flows through the first node 230 or the second node 235 (e.g., via a digit line 265). For example, a sense component 270 may determine whether an SLC memory cell 205 stores a logic 0 or a logic 1 in a binary manner (e.g., based on a presence or absence of a current through the memory cell 205 when a read voltage is applied to the control gate 215, or based on whether the current is above or below a threshold current). For a multiple-level memory cell 205, a sense component 270 may determine a logic value stored in the memory cell 205 based on various intermediate threshold levels of current when a read voltage is applied to the control gate 215. In one example of a multiple-level architecture, a sense component 270 may determine the logic value of a TLC memory cell 205 based on eight different levels of current, or ranges of current, that define the eight potential logic values that could be stored by the TLC memory cell 205.

An SLC memory cell 205 may be written by applying one of two voltages (e.g., a voltage above a threshold or a voltage below a threshold) to memory cell 205 to store, or not store, an electric charge on the charge trapping structure 220 and thereby cause the memory cell 205 to store one of two possible logic values. For example, when a first voltage is applied to the control node 240 (e.g., via the word line 260) relative to a bulk node 245 for the transistor 210 (e.g., when the control node 240 is at a higher voltage than the bulk), electrons may tunnel into the charge trapping structure 220. In some cases, the bulk node 245 may alternatively be referred to as a body node. Injection of electrons into the charge trapping structure 220 may be referred to as programing the memory cell 205 and may occur as part of a program operation. A programmed memory cell may, in some cases, be considered as storing a logic 0. When a second voltage is applied to the control node 240 (e.g., via the word line 260) relative to the bulk node 245 for the transistor 210 (e.g., when the control node 240 is at a lower voltage than the bulk node 245), electrons may leave the charge trapping structure 220. Removal of electrons from the charge trapping structure 220 may be referred to as erasing the memory cell 205 and may occur as part of an erase operation. An erased memory cell may, in some cases, be considered as storing a logic 1. In some cases, memory cells 205 may be programmed at a page 175 level of granularity due to memory cells 205 of a page 175 sharing a common word line 260, and memory cells 205 may be erased at a block 170 level of granularity due to memory cells 205 of a block sharing commonly biased bulk nodes 245.

In contrast to writing an SLC memory cell 205, writing a multiple-level (e.g., MLC, TLC, or QLC) memory cell 205 may involve applying different voltages to the memory cell 205 (e.g., to the control node 240 or bulk node 245 thereof) at a finer level of granularity to more finely control the amount of charge stored on the charge trapping structure 220, thereby enabling a larger set of logic values to be represented. Thus, multiple-level memory cells 205 may provide greater density of storage relative to SLC memory cells 205 but may, in some cases, involve narrower read or write margins or greater complexities for supporting circuitry.

A charge-trapping NAND memory cell 205 may operate similarly to a floating-gate NAND memory cell 205 but, instead of or in addition to storing a charge on a charge trapping structure 220, a charge-trapping NAND memory cell 205 may store a charge representing a logic state in a dielectric material below the control gate 215. Thus, a charge-trapping NAND memory cell 205 may or may not include a charge trapping structure 220.

In some examples, each row of memory cells 205 may be connected to a corresponding word line 260, and each column of memory cells 205 may be connected to a corresponding digit line 265. Thus, one memory cell 205 may be located at the intersection of a word line 260 and a digit line 265. This intersection may be referred to as an address of a memory cell 205. Digit lines 265 may alternatively be referred to as bit lines. In some cases, word lines 260 and digit lines 265 may be substantially perpendicular to one another and may create an array of memory cells 205. In some cases, word lines 260 and digit lines 265 may be generically referred to as access lines or select lines.

In some cases, memory device 200 may include a three-dimensional (3D) memory array, where multiple two-dimensional (2D) memory arrays may be formed on top of one another. This may increase the quantity of memory cells 205 that may be placed or fabricated on a single die or substrate as compared with 2D arrays, which may reduce production costs, or increase the performance of the memory array, or both. In the example of FIG. 2, memory device 200 includes multiple levels (e.g., decks) of memory cells 205. The levels may, in some examples, be separated by an electrically insulating material. Each level may be aligned or positioned so that memory cells 205 may be aligned (e.g., exactly aligned, overlapping, or approximately aligned) with one another across each level, forming a memory cell stack 275. In some cases, a memory cell stack 275 may be referred to as a string of memory cells 205 (e.g., as described with reference to FIG. 3).

Accessing memory cells 205 may be controlled through a row decoder 290 and a column decoder 250. For example, row decoder 290 may receive a row address from a memory controller 255 and activate an appropriate word line 260 based on the received row address. Similarly, column decoder 250 may receive a column address from memory controller 255 and activate an appropriate digit line 265. Thus, by activating one word line 260 and one digit line 265, one memory cell 205 may be accessed.

Upon accessing, a memory cell 205 may be read, or sensed, by sense component 270. For example, sense component 270 may be configured to determine the stored logic value of memory cell 205 based on a signal generated by accessing memory cell 205. The signal may include a current, a voltage, or both a current and a voltage on the digit line 265 for the memory cell 205 and may depend on the logic value stored by the memory cell 205. The sense component 270 may include various transistors or amplifiers configured to detect and amplify a signal (e.g., a current or voltage) on a digit line 265. The logic value of memory cell 205 as detected by the sense component 270 may be output via an input/output component 280. In some cases, sense component 270 may be a part of column decoder 250 or row decoder 290, or sense component 270 may otherwise be connected to or in electronic communication with column decoder 250 or row decoder 290.

A memory cell 205 may be programmed or written by activating the relevant word line 260 and digit line 265 to enable a logic value (e.g., representing one or more bits of information) to be stored in the memory cell 205. A column decoder 250 or a row decoder 290 may accept data, for example from input/output component 280, to be written to the memory cells 205. As previously discussed, in the case of NAND memory, such as flash memory used in some NAND and 3D NAND memory devices, a memory cell 205 may be written by storing electrons in a charge trapping structure or an insulating layer.

A memory controller 255 may control the operation (e.g., read, write, re-write, refresh) of memory cells 205 through the various components, for example, row decoder 290, column decoder 250, and sense component 270. In some cases, one or more of row decoder 290, column decoder 250, and sense component 270 may be co-located with memory controller 255. A memory controller 255 may generate row and column address signals 9 to activate the desired word line 260 and digit line 265. In some examples, a memory controller 255 may generate and control various voltages or currents used during the operation of memory device 200.

Figure 3:
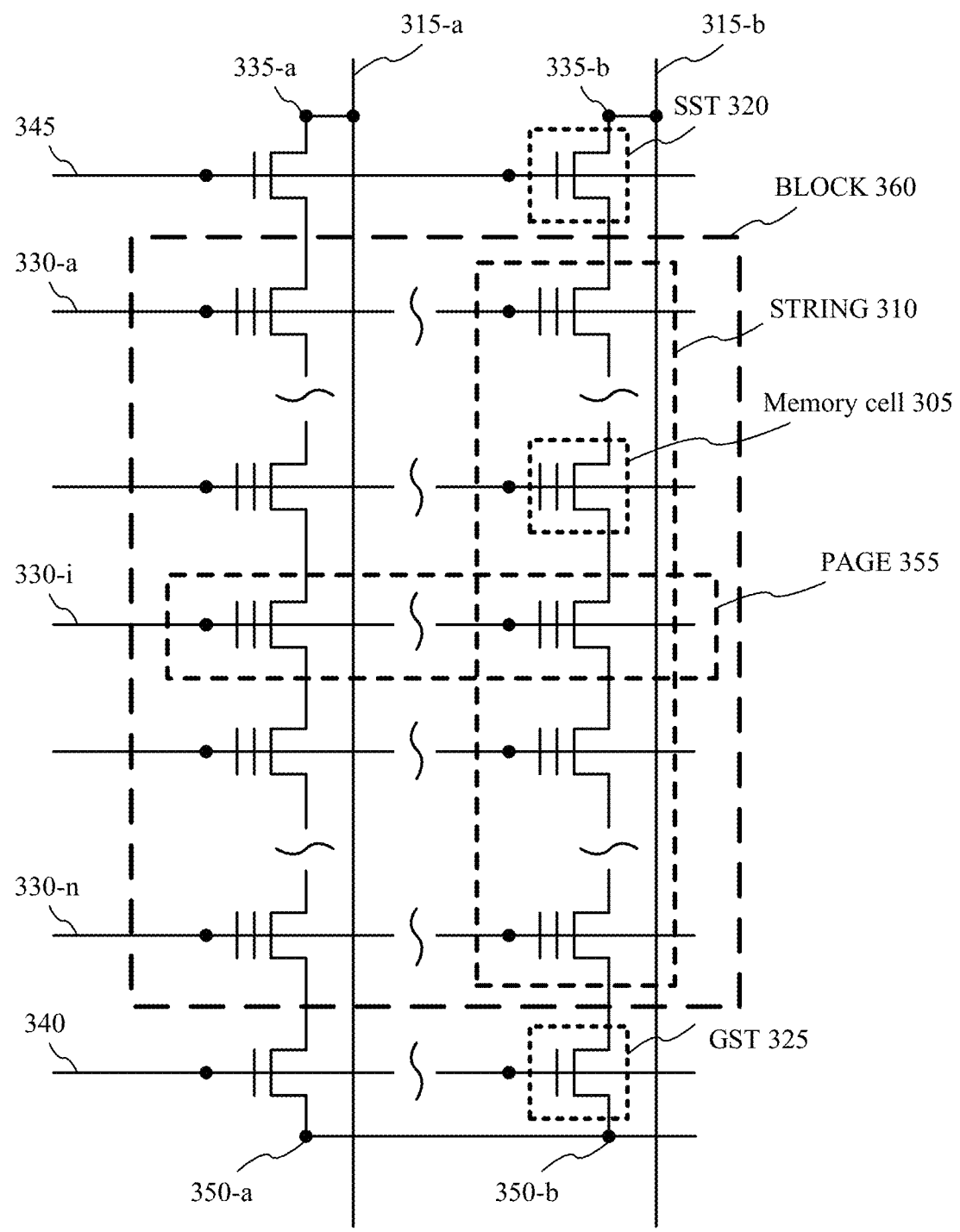
FIG. 3 illustrates an example of a memory circuit that supports programming multi-level memory cells in accordance with examples as disclosed herein.

FIG. 3 illustrates an example of a memory circuit 300 that supports programming multi-level memory cells in accordance with examples as disclosed herein. The memory circuit 300 may be an example of a portion of a memory device, such as a memory device 130 or a memory device 200. Although some elements included in FIG. 3 are labeled with reference numbers, some other corresponding elements are not labeled, though they are the same or would be understood to be similar, in an effort to increase visibility and clarity of the depicted features.

The memory circuit 300 includes multiple memory cells 305 (e.g., flash memory cells 205 as described with reference to FIG. 2) connected in a NAND configuration. In a NAND memory configuration, multiple flash memory cells 305 may be connected in series to form strings 310 of memory cells 305, in which a drain of each flash memory cell 305 in the string 310 may be coupled with a source of another flash memory cell 305 in the string.

A string 310 may be a set of memory cells 305 that are each associated with (e.g., coupled with) a corresponding digit line 315. Each memory cell 305 in a string 310 may be associated with a separate word line 330 (e.g., one of word lines 330-a, 330-i, 330-n), such that the quantity of word lines 330 may be equal to the quantity of memory cells 305 in a string 310. A string 310 as shown in FIG. 3 may be an example of aspects of a memory cell stack 275 as described with reference to FIG. 2, for example.

A page 355 may be a set of memory cells 305 that are each associated with (e.g., coupled with) a corresponding word line 330. Thus a string 310 may include memory cells 305 from multiple different pages 355, and a page 355 may include memory cells 305 from multiple different strings 310. A page 355 as shown in FIG. 3 may be an example of aspects of a page 175 as described with reference to FIG. 1, for example.

A block 360 may be a set of multiple pages 355 and thus may also include multiple strings 310. A block 360 as shown in FIG. 3 may be an example of aspects of a block 170 as described with reference to FIG. 1, for example.

In some cases, NAND memory cells 305 may be programmed (e.g., set to a logic 0 value) and read at the page 355 level of granularity, but may not be erasable (e.g., reset to a logic 1 value) at the page level of granularity. For example, NAND memory may instead be erasable at a higher level of granularity, such as at the block 360 level of granularity. In some cases, a NAND memory cell 305 may be erased before it may be re-programmed. Different memory devices may have different read, write, or erase characteristics.

In some cases, each string 310 of memory cells 305 in the memory circuit 300 may be coupled with a respective string select transistor (SST) 320 at one end of the string 310 and a respective ground select transistor (GST) 325 at the other end of the string 310. The gate of each SST 320 may be coupled with a string select line 345, which may be common to all SSTs 320 for the block 360. The gate of each GST 325 may be coupled with a ground select line 340, which may be common to all GSTs 325 for the block 360. The source of each GST 325 for the block 360 may be coupled with a common source line 350. And the drain of each SST 320 may be coupled with a respective digit line 315, the respective digit line 315 specific to an individual string 310.

An SST 320 may be used to selectively couple a corresponding string 310 of memory cells 305 to a digit line 315, based on applying a voltage to the string select line 345, and thus to the gate of SST 320. Similarly, a GST 325 may be used to selectively couple the corresponding string 310 of memory cells 305 to the source line 350, based on applying a voltage to ground select line 340, and thus to the gate of GST 325.

To operate the memory circuit 300 (e.g., to perform a program operation, a read operation, or an erase operation on one or more memory cells 305 of the block 360), various voltages may be applied to the string select line 345 (e.g., to the gates of the SSTs 320), to one or more digit lines 315 (e.g., to the drain 335 of one or more SSTs 320), to one or more word lines 330, to the ground select line 340 (e.g., to the gates of the GSTs 325), to the source line 350 (e.g., to the sources of the GSTs 325), or to a bulk for the memory cells 305 (not shown) of the block 360. In some cases, each memory cell 305 of a block 360 may have a common bulk, the voltage of which may be controlled independently of bulks for other blocks 360.

In some cases, as part of a read operation for a memory cell 305, a positive voltage may be applied to the corresponding digit line 315 while the source line 350 may be grounded or otherwise biased at a voltage lower than the voltage applied to the digit line 315. Concurrently, voltages may be applied to the string select line 345 and the ground select line 340 that are above the threshold voltages of the SST 320 and the GST 325 for the memory cell 305 respectively, thereby turning the SST 320 and GST 325 "ON" such that a channel associated with the string 310 that includes the memory cell 305 may be electrically connected to the corresponding digit line 315 and the source line 350. A channel may be an electrical path through the memory cells 305 in the string 310 (e.g., through the sources and drains of the transistors in the memory cells 305 of the string 310) that may conduct current under some operating conditions.

Concurrently, multiple word lines 330 (e.g., in some cases all word lines 330) of the block 360—except a selected word line 330 coupled with the memory cell 305 to be read)—may be set to a voltage (e.g., VREAD) that is higher than the threshold voltage (VT) of the memory cells 305. VREAD may cause all memory cells 305 in the unselected pages 355 (e.g., rows) to turn "ON" so that each unselected memory cell 305 in the string 310 may maintain high conductivity within the channel. In some examples, the word line 330 associated with the memory cell 305 to be read may be set to a voltage, VTarget. Where the memory cells 305 are operated as SLC memory cells, VTarget may be a voltage that is between (i) VT of a memory cell 305 in an erased state and (ii) VT of a memory cell 305 in a programmed state.

When the memory cell 305 to be read exhibits an erased VT (e.g., VTarget>VT of the memory cell 305), the memory cell 305 may turn "ON" in response to the application of VTarget to the selected word line 330, which may allow a current to flow in the channel of the string 310, and thus from the digit line 315 to the source line 350. When the memory cell 305 to be read exhibits a programmed VT (e.g., VTarget<VT of the selected memory cell), the memory cell 305 may remain "OFF" despite the application of VTarget to the selected word line 330, and thus may prevent a current from flowing in the channel of the string 310, and thus from the digit line 315 to the source line 350.

A signal on the digit line 315 for the memory cell 305 (e.g., an amount of current below or above a threshold) may be sensed (e.g., by a sense component 270 as described with reference to FIG. 2), and may indicate whether the memory cell 305 became conductive or remained non-conductive in response to the application of VTarget to the selected word line 330. The sensed signal thus may be indicative of whether the memory cell 305 was in an erased state (e.g., storing a logic 1) or a programmed state (e.g., storing a logic 0). In some cases, a single read operation may read one page 355 of memory cells 305, as the memory cells 305 of the page 355 may all share a common word line 330, based on respective signals associated with the respective digit lines 315 for the memory cells 305 of the selected page 355.

Though aspects of the example read operation above have been explained in the context of an SLC memory cell 305 for clarity, one of ordinary skill in the art will appreciate how techniques may be extended or altered and applied to the context of a multiple-level memory cell 305 (e.g., through the use of multiple values of VTarget corresponding to the different amounts of charge that may be stored in one multiple-level memory cell 305).

In some cases, as part of a program operation for a memory cell 305, charge may be added to a portion of the memory cell 305 such that current flow through the memory cell 305, and thus the corresponding string 310, may be inhibited when the memory cell 305 is later read. For example, charge may be injected into a charge trapping structure 220 as shown in memory cell 205-a of FIG. 2. In some cases, respective voltages may be applied to the word line 330 and the bulk of the memory cell 305 to be programmed such that the control gate 215 of the memory cell 305 is at a higher voltage than the bulk of the memory cell 305 (e.g., a positive voltage may be applied to the word line 330). Concurrently, voltages may be applied to the string select line 345 and the ground select line 340 that are above the threshold voltages of the SST 320 and the GST 325 for the memory cell 305 respectively, thereby turning the SST 320 and GST 325 "ON," and the digit line 315 for the memory cell 305 to be programmed may be set to a relatively high voltage. This may cause an electric field such that electrons are pulled from the source of the memory cell 305 towards the drain. The electric field may also cause some of these electrons to be pulled through the dielectric material 225 and thereby injected into the charge trapping structure 220 of the memory cell 205, through a process which may in some cases be referred to as tunnel injection. In some cases, programming the memory cell 305 may correspond to writing a logic 0 to the memory cell 305.

In some cases, a single program operation may program some or all memory cells 305 in a page 355, as the memory cells 305 of the page 355 may all share a common word line 330 and a common bulk. For a memory cell 305 of the page 355 for which it is not desired to write a logic 0 (e.g., not desired to program the memory cell 305), the corresponding digit line 315 may be set to a relatively low voltage (e.g., ground), which may inhibit the injection of electrons into the charge trapping structure 220.

Though aspects of the example program operation above have been explained in the context of an SLC memory cell 305 for clarity, one of ordinary skill in the art will appreciate how techniques may be extended and applied to the context of a multiple-level memory cell 305 (e.g., through the use of multiple programing voltages applied to the word line 330 or multiple passes or pulses of a programing voltage applied to the word line 330, corresponding to the different amounts of charge that may be stored in one multiple-level memory cell 305, as discussed in more detail below).

In some cases, as part of an erase operation for a memory cell 305, charge may be removed from a portion of the memory cell 305 such that current flow through the memory cell 305, and thus the corresponding string 310, may be uninhibited (e.g., allowed, at least to a greater extent) when the memory cell 305 is later read. For example, charge may be removed from a charge trapping structure 220 as shown in memory cell 205-a of FIG. 2. In some cases, respective voltages may be applied to the word line 330 and the bulk of the memory cell 305 to be erased such that the control gate 215 of the memory cell 305 is at a lower voltage than the bulk of the memory cell 305 (e.g., a positive voltage may be applied to the bulk), which may cause an electric field that pulls electrons out of the charge trapping structure 220 and into the bulk of the memory cell 305. In some cases, a single program operation may erase all memory cells 305 in a block 360, as the memory cells 305 of the block 360 may all share a common bulk.

In some cases, electron injection and removal processes associated with program and erase operations may cause stress on a memory cell 305 (e.g., on the dielectric material 225). Over time, such stress may in some cases cause one or more aspects of the memory cell 305 (e.g., the dielectric material 225) to deteriorate. For example, charge trapping structure 220 may become unable to maintain a stored charge. Such deterioration may be an example of a wearout mechanism for a memory cell 305, and for this or other reasons, some memory cells 305 may support a finite quantity of program and erase cycles.

Figure 4:
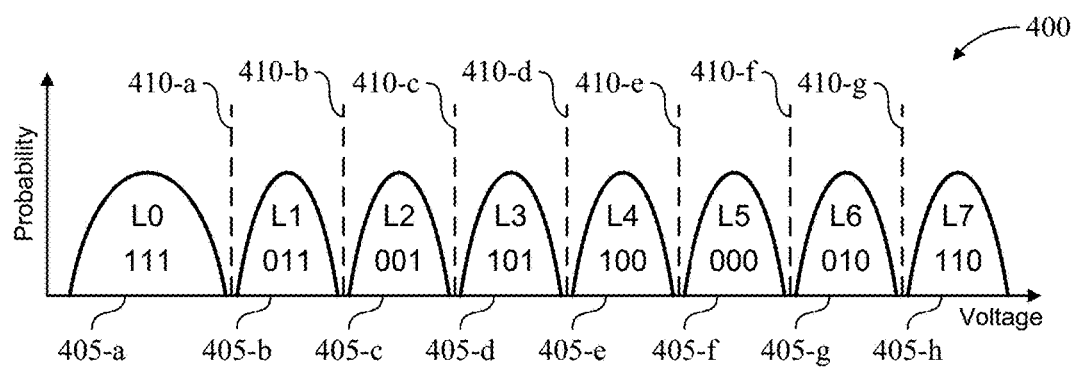
FIG. 4 illustrates an example of a distribution plot that supports programming multi-level memory cells in accordance with examples as disclosed herein.

FIG. 4 illustrates an example of a distribution plot 400 that supports programming multi-level memory cells in accordance with examples as disclosed herein. The distribution plot 400 may illustrate example distributions of a TLC as described herein. Similar distribution plots 400 may apply for memory cells that store other quantities of bits. For example, an MLC or QLC may be associated with a similar distribution plot 400 with different quantities of voltage distributions 405 (e.g., based on a quantity of bits stored by the memory cell).

The distribution plot 400 may illustrate voltage distributions 405 associated with different logic states of a TLC. The example voltage distributions 405 shown in distribution plot 400 include voltage distributions 405-a, 405-b, 405-c, 405-d, 405-e, 405-f, 405-g, and 405-g of a TLC storing the logic values '111,' '011,' '001,' '101,' '100,' '000,' '010,' and '110,' respectively. In some cases, each logic state may correspond to data associated with more than one page of data. For example, the voltage distribution 405-h may be associated with the logic value '110.' The logic value '110' may include data associated with three pages (e.g., a first page, a second page, and a third page). That is, the first bit '0' may be associated with a first page, the second bit '1' may be associated with a second page, and the third bit '1' may be associated with a third page.

In some other examples, a distribution plot 400 may illustrate voltage distributions 405 of a TLC storing other values than those illustrated by the distribution plot 400. For example, each voltage distribution 405 may correspond to the inverted logic values. That is, voltage distribution 405-a may correspond to a TLC storing the logic value '000.' Additionally, voltage distribution 405-d may illustrate the voltage distribution 405-d of a TLC storing the logic value '010.'

The distribution plot 400 also illustrates reference thresholds 410. The reference thresholds 410 may be examples of threshold voltages as described with reference to FIGS. 2 and 3. A memory device may apply one or more reference thresholds 410 to one or more memory cells to determine the logic values stored by the one or more memory cells. For example, the memory device may apply each of the reference thresholds 410 to one or more memory cells to read each page of data stored by the one or more memory cells. In another example, the memory device may apply a subset of the reference thresholds 410 to the one or more memory cells to read a subset of the pages of data stored by the one or more memory cells. For example, the memory device may apply only reference threshold 410-d to determine a value stored by the memory cell associated with a first page. That is, if current flows from the memory cell after applying the reference threshold 410-d to the memory cell, the memory device may determine that the value stored by the memory cell associated with the first page is a logic value '0.' Alternatively, if current does not flow from the memory cell after applying the reference threshold 410-d to the memory cell, the memory device may determine that the value stored by the memory cell associated with the first page is a logic value '1.'

In another example, the memory device may apply two, three, or more reference thresholds 410 to the memory cell to determine values stored by the memory cell associated with the second page, or with the first page and the second page. For example, the memory device may apply reference thresholds 410-b and 410-f to determine a second page of data, or reference thresholds 410-a, 410-c, 410-e, and 410-g to determine a third page of data.

Figure 5A:
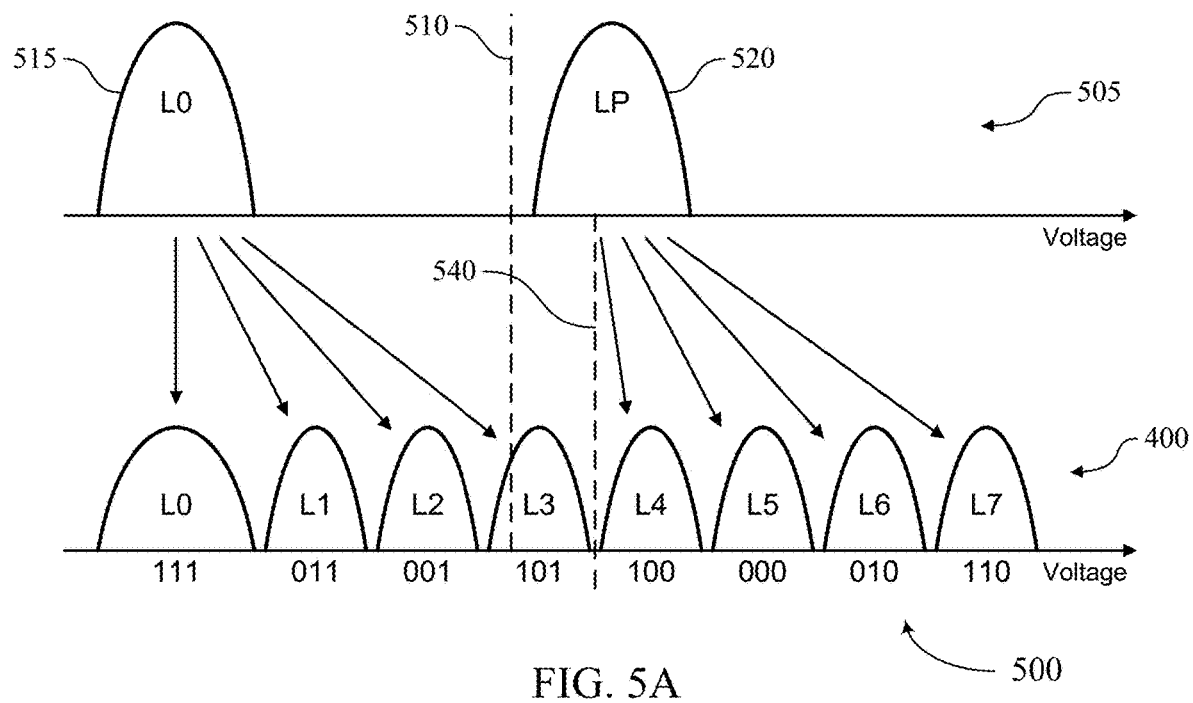
FIGS. 5A and 5B illustrate an example of a two-pass programming scheme that supports programming multi-level memory cells in accordance with examples as disclosed herein.
Figure 5B:
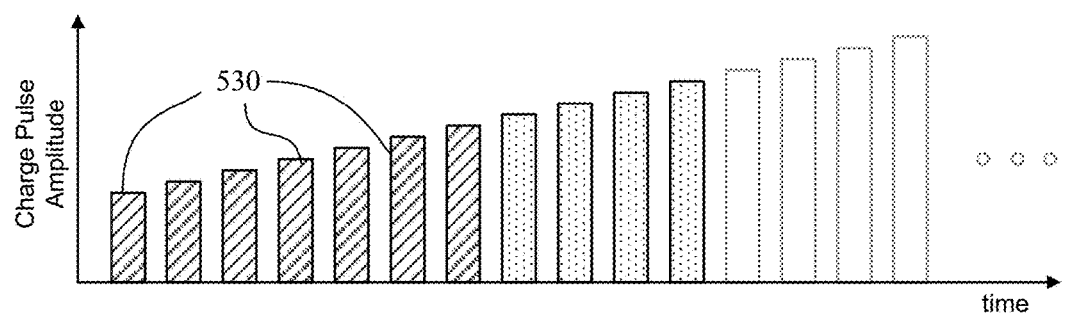

FIGS. 5A and 5B illustrate an example of a two-pass programming scheme 500 and related charge pulses 530 that support programming multi-level memory cells in accordance with examples as disclosed herein. In general, a first pass may be performed to program each memory cell to a first or second level, based on a first set of bits. Then, a second pass may be performed to program each memory cell to one of a set of levels based on further sets of bits.

A memory cell, e.g., an MLC, may be used as an SLC to store a single bit of data. This may be reflected in the distribution plot 505, which may depict the distribution of signals for single bits of data. To reflect the data bit being stored, the memory cell's state (e.g., charge) may be placed in an L0 distribution 515 or an LP distribution 520, on either side of a reference threshold 510, e.g., in the manner discussed with reference to FIG. 2. If the charge of a memory cell is within the L0 distribution 515, the data bit of the memory cell may be considered to be a logic 1. If the signal of a memory cell is within the LP distribution 520, the data bit of the memory cell may be considered to be a logic 0. Accordingly, to detect or read the data bit, the memory device may determine if the charge is above or below the reference threshold 510, e.g., in the manner discussed with reference to FIG. 2.

The cells may be moved to their respective distribution levels by programming. Moving a memory cell to a particular level may also be known as programming the memory cell to the particular level. In some examples, multiple cells may be programmed concurrently. Programming of memory cells may include applying one or more charge pulses 530 to the cells to increase the signal values of those cells (e.g., move the charge levels to the right in distribution plot 505). In some examples, the charge pulses 530 may be increased over time, as shown in FIG. 5B, to incrementally increase the charge levels of the cells. For example, to program a memory cell to the LP level 520, charge pulses 530 may be applied until the cell's charge may reach the LP level 520.

If the memory cell is an MLC, it may be desired to store additional bits on the cell. For example, a TLC may store three bits of data using eight different charge levels and a QLC may store four bits of data using sixteen different charge levels. To retain the bit that was stored in the cell, the additional data may be superposed on the cell over the bit(s) originally stored by the MLC. In some examples, a memory device may store the original data bits as a first page stored in the MLCs.

In some examples, programming of the first page may be done in a first pass and programming of additional pages may follow in a second pass. For example, during a first pass associated with a TLC, each memory cell may be programmed to the L0 level 515 or the LP level 520 (e.g., using one or more charge pulses 530 as discussed above). In those cases, the reference threshold 510 may be used to differentiate between a logic 0 and a logic 1 for the first page after the first pass. In some examples, the first pass may take place while the memory cell is being used as an SLC. In some examples, the first pass may take place while the memory cell is being used as an MLC (e.g., more than one bit stored in the first pass).

During the second pass, each memory cell previously programmed to L0 may be programmed to one of lower levels L0 to L3 and each memory cell previously programmed to LP may be programmed to one of upper levels L4 to L7, based on the second and third bits (e.g., for a cell used as a TLC cell). That is, each cell at level L0 515 after the first pass may be moved to one of lower levels L0 to L3 and each cell at LP 520 after the first pass may be moved to one of upper levels L4 to L7. The lower levels of the TLC may be separated from the upper levels by a reference threshold 540. In those cases, the reference threshold 540 may be used to differentiate between a logic 0 and a logic 1 for the first page of data (e.g., corresponding to the original bits) after the second pass. In some examples, the value of reference threshold 540 may be different than the value of reference threshold 510.

To program a cell to a particular level in the second pass, (e.g., move the cell's charge level from L0 to one of L0-L3, or from LP to one of L4-L7), one or more charge pulses 530 may be applied to the cell (e.g., in a similar manner to the first pass). In some examples, a program voltage may be applied to the cell that may provide the charge pulse. In some examples, the charge pulses 530 may be increased (e.g., in voltage or current) over time, as shown in FIG. 5B, to incrementally increase the charge level of the cell. In some examples, each charge pulse 530 may be applied to many cells concurrently to increase the charge level of those cells concurrently. In some examples, when a cell's charge may reach its corresponding level (e.g., any of L0-L6), the programming of the cell may be considered to be complete and the cell may be inhibited to prevent the cell from moving further up due to further pulses 530 being applied to the cells. In some examples, instead of or in addition to inhibiting a cell when its charge reaches its corresponding level, the further pulses 530 may not be applied to the cell. In some examples, the pulses may be applied such that the cells reach the levels in order (e.g., L1, then L2, then L3, then L4, then L5, etc.).

In some examples, programming of the lower-level cells (e.g., from L0 to L0-L3) may occur before programming of the upper-level cells (e.g., from LP to L4-L7) during the second pass. This may occur because the upper-level cells may already have charge at the LP level 520; the charge pulses applied to the lower-level cells may not be applied to the upper-level cells or may not affect them.

As discussed above, the reference threshold for the first page after the first pass (e.g., reference threshold 510 between levels L0 and LP) may be different than the reference threshold for the first page after the second pass (e.g., reference threshold 540 between the lower levels L0-L3 and the upper levels L4-L7). This may cause problems, e.g. if power is lost during the programming.

In some cases, an upper-page program may be interrupted (e.g., during an unexpected power loss) while the cells are being moved up (to the right in FIG. 5A). The cells programmed by an incomplete program operation may end up incorrectly at any level or indeterminately in between detection levels, which may result in an unfinished upper-page program, or worse, corrupted adjacent lower-page data that may have been programmed in the distant past. Some of the data for the second page may be recoverable because it may be maintained in the source for the programming. However, the lower page may be lost because the only location it may be stored is in the memory being programmed. And because the thresholds may be different, some of the first page data may have values that may overlap with values of the upper pages. This may make the lower page unrecoverable.

Figure 6A:
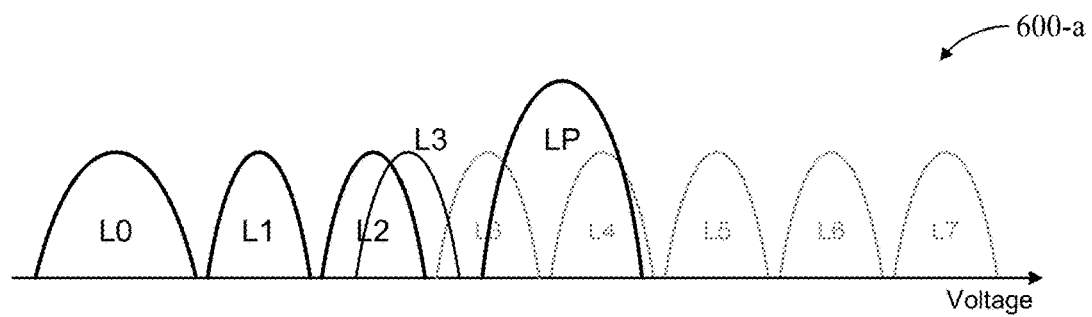
FIGS. 6A through 6C illustrate an example of a two-pass programming scheme that supports programming multi-level memory cells in accordance with examples as disclosed herein.
Figure 6B:
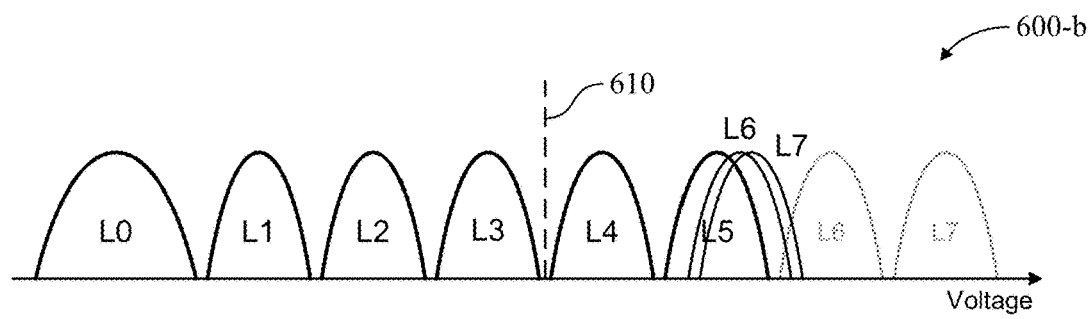
Figure 6C:
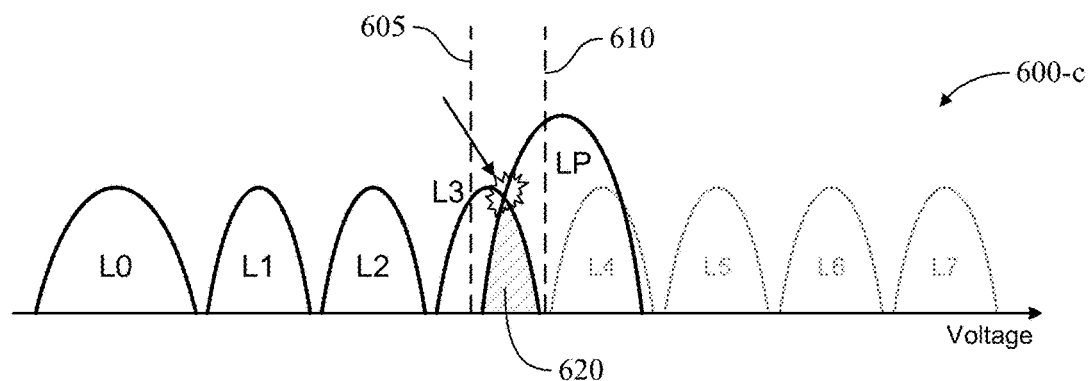

FIGS. 6A through 6C show stages 600-a, 600-b, and 600-c of a second-pass programming scheme that supports programming multi-level memory cells in accordance with examples as disclosed herein. The programming scheme may be directed to a TLC memory but may be expanded for other types of MLCs (e.g., a QLC). The memory cells may have already been programmed to the L0 and LP levels during a first pass.

First, the lower-level cells (e.g., cells originally programmed to L0 during a first pass) may be programmed to L1 through L3, based on the second- and third-page data. This may be accomplished by applying one or more charge pulses to the cells to move the corresponding charge levels up from level L0 to lower levels L1, L2, and L3 (e.g., as discussed above with reference to FIGS. 5A and 5B). Cells destined to L0 may have already been programmed to L0 (e.g., during the first pass) so their programming may have already been completed (e.g., they may be inhibited for the charge pulses related to levels L1, L2, and L3).

In some examples, the one or more charge pulses may be applied to all of the lower-level cells destined to levels L1 through L3. This may move the charge levels of those cells up from level L0 to level L1. When the charge levels reach level L1, the programming of the cells destined to L1 may be complete and those cells may be inhibited so that they may be unaffected by further charge pulses.

One or more further charge pulses may be applied to the lower-level cells to move the charge levels of those cells further up from level L1 to level L2. When the charge levels reach level L2, the programming of the cells destined to L2 may be complete and those cells may be inhibited so that they may be unaffected by further charge pulses.

One or more further charge pulses may be applied to the lower-level cells to move the charge levels of those cells further up from level L2 to level L3. When the cells reach level L3, the programming of the cells destined to L3 may be complete and those cells may be inhibited so that they may be unaffected by further charge pulses. FIG. 6A depicts a state where the programming of the cells destined to levels L0-L2 may have been completed and cells destined for L3 may still be in the process of being programmed. Note that the upper level cells (e.g., cells originally programmed to LP during a first pass) may be awaiting programming to levels L4 through L7.

This method of applying charge pulses to lower-level cells and then selectively inhibiting the cells when their charge levels have arrived at their destined level may continue until all of the lower-level cells may have been programmed to their destined charge level. Alternatively, instead of or in conjunction with inhibiting the cells, once a cell's charge reaches its destined level, further charge pulses may not be applied to those cells (e.g., the cells may be inhibited).

Second, the upper-level cells (e.g., cells originally programmed to LP during a first pass) may be programmed to L4 through L7, based on the second- and third-page data. In some examples, this may be done after the lower-level cells have been programmed.

Programming of the upper-level cells may be done in a similar manner as the lower-level cells, by applying one or more charge pulses to the cells to move the corresponding charge levels up to their destined levels. For the upper-level cells that may mean moving the charge levels from level LP to upper levels L4, L5, L6, and L7. For example, one or more charge pulses may be applied to the upper-level cells to move the corresponding charge levels up through levels L4 through L7, with each cell completing its programming and becoming inhibited when the cell reaches its destined level. FIG. 6B depicts a state where the programming of the cells destined for L4 and L5 may have been completed (along with the programming of all of the lower-level cells) and the cells destined for L6 and L7 may still be in the process of being programmed.

In some examples, instead of or in conjunction with inhibiting a cell when the cell's charge reaches its destined level, the further charge pulses may not be applied to the cell when the destined charge level is reached.

In some examples, level LP may be at a lower voltage level than the lowest upper level L4 (e.g., as depicted in FIG. 6C). This may be due to different reference thresholds used for the first page in the first pass (e.g., reference threshold 605) and in the second pass (e.g., reference threshold 610). The different reference thresholds may be caused by, for example, different conditions such as temperature or operating voltage. When this is the case, charge pulses may be applied to cells destined to L4 to complete the programming of the cells destined to L4 (e.g., to move their charge levels up from level LP to level L4).

Because of the difference in reference thresholds (e.g., between reference threshold 605 and reference threshold 610), this may cause an overlap between the original level LP and at least one of the lower levels L0-L3 (e.g., overlap 620 between level LP and level L3). Because of this, the charge levels of some of the programmed lower-level cells (e.g., at level L3) and the charge levels of some of the yet-to-be programmed upper-level cells (e.g., at level LP) may be in the overlap area 620 at the same time. This may occur, e.g., after programming of the lower-level cells has been completed and before programming of the upper-level charge levels has commenced, as depicted in FIG. 6C.

If power is lost at this point in the programming, the first-page data (e.g., the first data bit) of the memory cells whose charge levels may be within the overlap area may be unknown. That is, the charge levels may represent a logic 0 or a logic 1 depending on whether the corresponding cell has been programmed yet in the second pass. And since it may not be clear upon a subsequent power up whether that has happened, the data bit corresponding to the corresponding cell may not be ascertainable. Because the only location that the first-page data may be stored may be in the memory being programmed, the data bit may be unrecoverable.

Once the upper-level cells in the second pass have been moved up past level L3 (e.g., up past reference threshold 610 as in FIG. 6B), none of the charge levels may overlap, which may alleviate the problem. That is, the lower page data may be recoverable if power is lost at that point.

Figure 7:
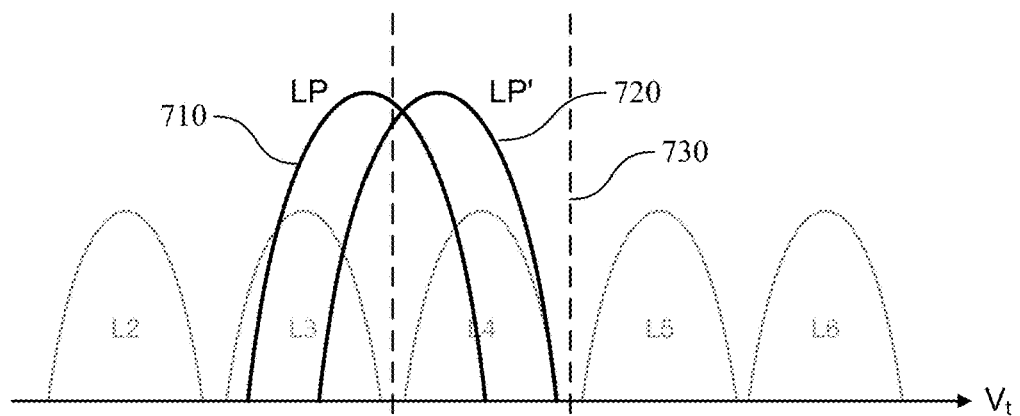
FIG. 7 illustrates an example of a lower page cell offset approach that supports programming multi-level memory cells in accordance with examples as disclosed herein.
Figure 8:
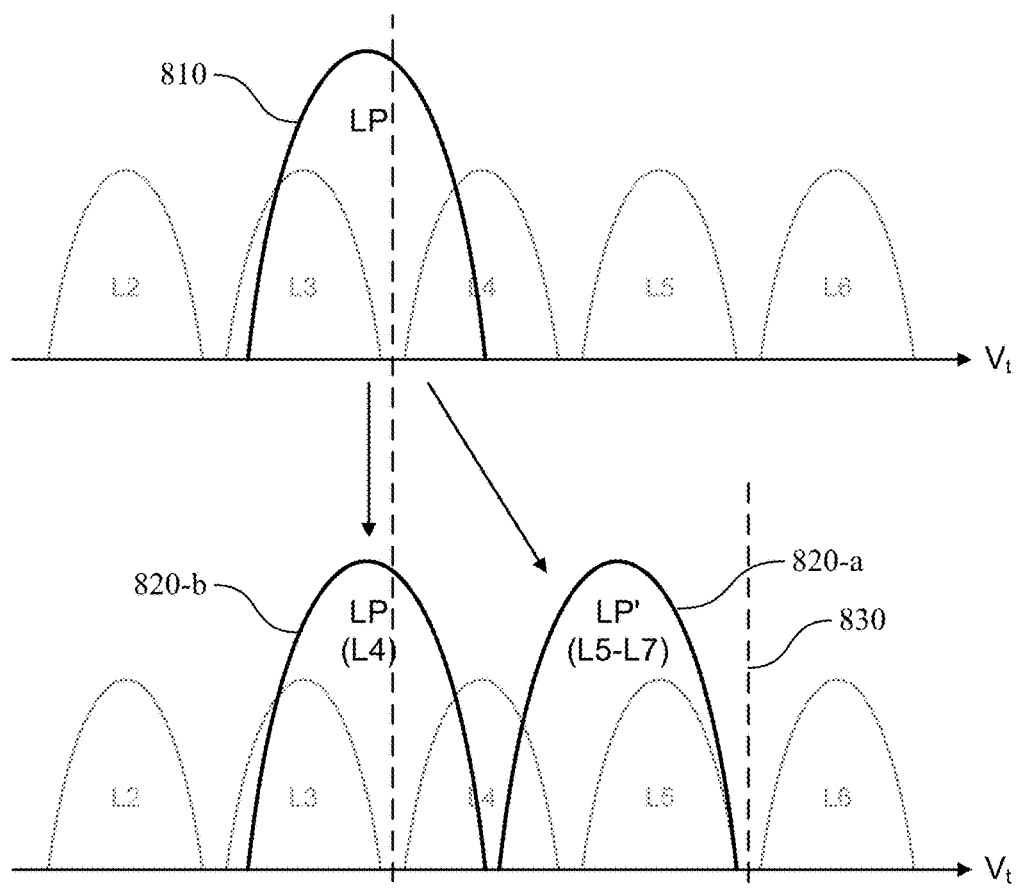
FIG. 8 illustrates an example of a lower page cell offset approach that supports programming multi-level memory cells in accordance with examples as disclosed herein.
Figure 9:
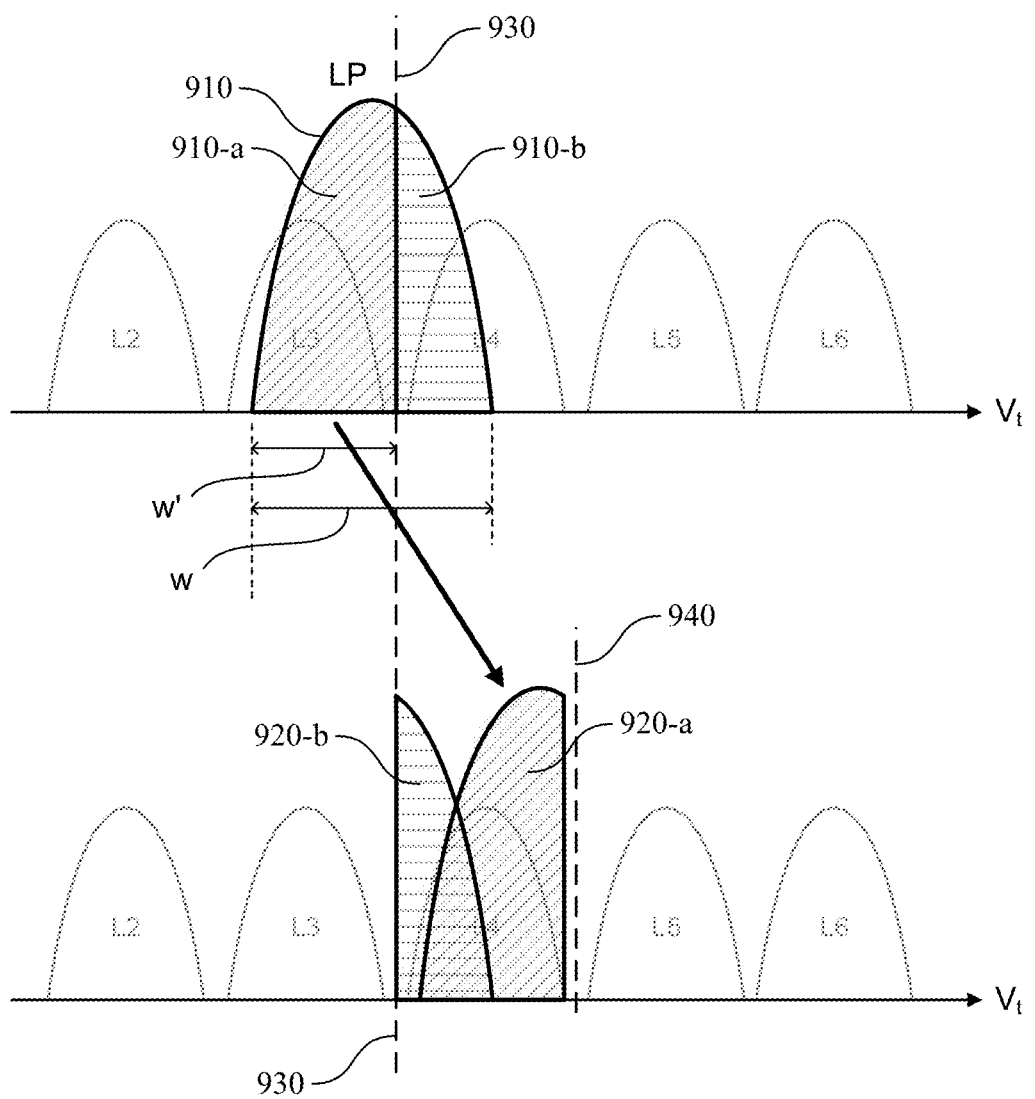
FIG. 9 illustrates an example of a lower page cell offset approach that supports programming multi-level memory cells in accordance with examples as disclosed herein.

FIGS. 7-9 illustrate various approaches to providing an offset to the upper-level cells by applying one or more offset charge pulses. In some examples, the offset may be provided by applying a single offset charge pulse. In some examples, the offset may be provided by applying a plurality of offset charge pulses. The offset may mitigate or eliminate the problem discussed above by reducing or eliminating the overlapping of charge levels during the second pass. In general, it may be desired to provide the offset before the lower-level cells reach a level (e.g., L3) that may cause an overlap with the original LP level.

The offset may be applied anytime before the upper-level cells—cells originally having charge levels at the LP level—may be programmed to the upper levels (e.g., L4-L7). In some examples, the offset may be applied before the second-pass programming has begun. For example, the offset may be applied before any of the lower-level cells have been programmed to the lower levels (e.g., L0-L3). In some examples, the offset may be applied after a checkpoint has occurred. In some examples, the checkpoint may include, e.g., a distribution of a lower level (e.g., L0, L1, L2, or L3) being formed, a lower level being reached during the second-pass programming, or a lower-level cell reaching a threshold.

For the sake of clarity, not all of the upper and lower levels are shown in FIGS. 7-9; only levels L2-L6 are shown. They are included to provide context and to show how the LP cell offsets may move the LP cells' charge levels in relation to those levels.

FIG. 7 illustrates an example of an LP cell offset approach 700 that supports programming multi-level memory cells in accordance with examples as disclosed herein. In LP cell offset approach 700, one or more offset charges may be applied to all upper-level cells. This may have the effect of moving the charge levels of the cells from the original LP distribution 710 to a second LP' distribution 720. Because the LP' distribution 720 may include charge levels destined to the lowest upper level L4, it may be desirable to keep the LP' distribution 720 below reference threshold 730 separating levels L4 and L5. Otherwise, charge levels that are above reference threshold 730 and destined to L4 may not be movable down to level L4 during the second pass.

Because of this constraint, the LP' distribution 720— while moved up from the original LP distribution 710—may still overlap the distribution of lower level L3, as depicted in FIG. 7. This overlap area may be smaller than with the original LP distribution so as to alleviate at least some of the problems discussed above, but since an overlap may still be present, some of the problems may still occur. That is, all or a portion of the lower page data may still be unrecoverable if power is lost. However, error correction techniques may be used to recover the lower page data based on the LP' distribution 720 (e.g., if the number of errors in the lower page data bits is below a threshold).

FIG. 8 illustrates an example of an LP cell offset approach 800 that supports programming multi-level memory cells in accordance with examples as disclosed herein. In LP cell offset approach 800, one or more offset charges may be applied to a portion of the upper-level cells. For example, the offset may be applied to the upper-level cells whose charge levels are not destined to the lowest upper level L4. This may have the effect of moving the cells destined to levels L5-L7 from the original LP distribution 810 to a second LP' distribution 820-a while leaving the cells destined to L4 remaining at the original LP distribution 820-b.

Because the LP' distribution 820-a may not include cells destined for level L4, the LP' distribution 820-a may be moved up further than in LP cell offset 700; it may be desirable to keep the LP' distribution 820-a below reference threshold 830 separating levels L5 and L6. As a result, there may be no overlap between the LP' distribution 820-a and the distribution of level L3, as depicted in FIG. 8.

However, the cells remaining at the original LP distribution 820-b (those destined to layer L4) may remain overlapping the distribution of level L3. This may result in the same problems as discussed above with reference to FIG. 6B. That is, all or a portion of the lower page data may still be unrecoverable if power is lost. But since this may only involve the upper-level cells destined to level L4, it may alleviate at least some of the problems; the problems may only apply to a fraction of the upper-level cells it would have. For example, since it may only affect one level out of four (e.g., L4 out of L4-L7) it may affect about 75% less of the TLC cells it would have otherwise. In some cases, error correction techniques may be used to recover the lower page data using LP cell offset approach 800.

FIG. 9 illustrates an example of an LP cell offset 900 that supports programming multi-level memory cells in accordance with examples as disclosed herein. In LP cell offset approach 900, one or more offset charges may be applied to only a portion of the upper-level cells, similar to LP cell offset approach 800. But in LP cell offset approach 900, the offset may be applied to upper-level cells whose charge levels are in a portion of the LP distribution 910. For example, the offset may be applied to the upper-level cells whose charge levels may be within a portion 910-a of the LP distribution that is below the reference threshold 930 that may separate the lower-level cells from the upper-level cells (e.g., between L3 and L4). This may have the effect of moving the upper-level cells within the portion 910-a from the original LP distribution 910 to a second LP' distribution 920-a while leaving a second portion of the cells (e.g., the remaining upper-level cells, which may be within the portion 910-b) remaining at the original LP distribution 910-b.

In some examples, the portion 910-a may have a narrower distribution than the entire LP distribution. For example, the portion 910-a may have a distribution width w' that may be less than the distribution width w of the entire LP level 910. Similar to LP cell offset 700, because the LP' distribution 920-a may include cells destined to level L4, it may be desired to keep the LP' distribution 920-a below reference threshold 940 separating levels L4 and L5. But because the distribution width w' of the portion 910-a may be less than the distribution width w of the entire LP portion 910, the LP' distribution 920-a may fit between reference threshold 940 and reference threshold 930 separating levels L3 and L4. And because the second portion 910-b of cells remain above the reference threshold 930, there may be no overlap between the distribution of level L3 and the LP' distributions 920-a and 920-b, as depicted in FIG. 9. So LP cell offset approach 900 may eliminate the problems discussed above. That is, the lower page data may be recoverable if power is lost.

In some examples, to determine which upper-level cells have charge levels that are originally within the portion 910-a of the LP distribution 910, a read access operation may be used. For example, the memory device may apply the reference threshold 930 to the upper-level cells to read the cells. The cells having charge levels below the reference threshold 930 may each be read as a logic 1, while the cells having charge levels above the reference threshold 930 may each be read as a logic 0. Thus, the cells that are read as a logic 1 may be considered to have charge levels within the portion 910-a.

So while LP cell offset approach 900 may provide the best approach with respect to recovering the first-page data, it may take more time than the other approaches due to an extra read that may be used to determine which cells to apply the offset charges to.

In some cases, LP cell offset approach 900 may be used in conjunction with LP cell offset approach 800. For example, LP cell offset approach 900 may be used on those cells destined for charge level L4, while LP cell offset approach 900 may be used on those cells destined for charge levels L5-L7.

Figure 10:
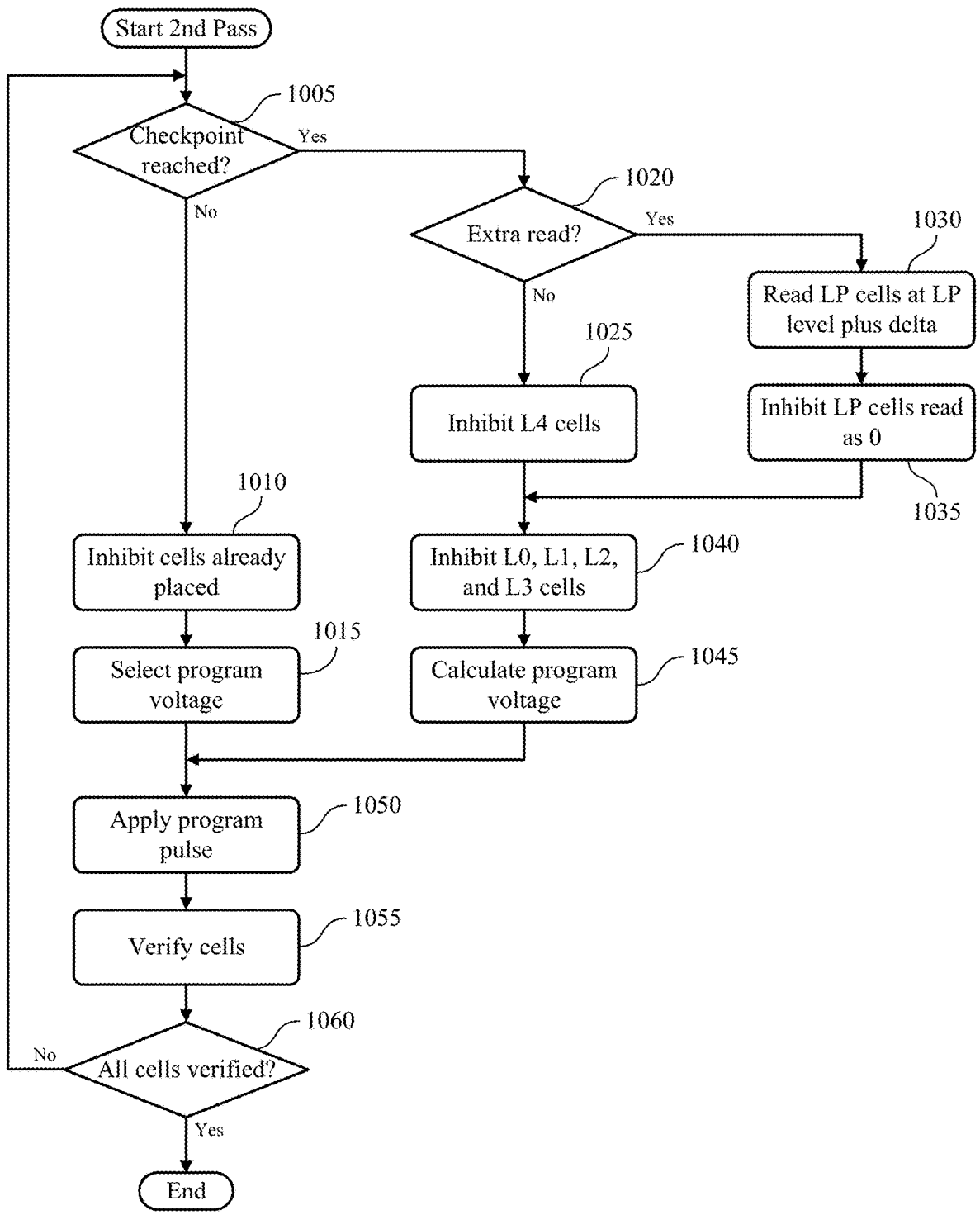
FIG. 10 shows a flowchart illustrating a method that supports programming multi-level memory cells in accordance with examples as disclosed herein.

FIG. 10 shows a flowchart illustrating a method 1000 that supports programming multi-level memory cells in accordance with examples as disclosed herein. The operations of method 1000 may be implemented by a memory device or its components as described herein. For example, the operations of method 1000 may be performed by a memory device as described with reference to FIGS. 1 through 9. In some examples, a memory device may execute a set of instructions to control the functional elements of the device to perform the described functions. Additionally or alternatively, the memory device may perform aspects of the described functions using special-purpose hardware.

In some examples, method 1000 may be performed after a first pass has been performed, as discussed with reference to FIGS. 5A and 5B. Method 1000 may include a loop that may be cycled through each time a charge pulse (e.g., a program pulse or an offset pulse) may be applied to the memory cells.

In general, each time through the loop, it may be determined whether an offset is to be applied based on whether a checkpoint has been reached. If so, the LP cells to be offset may be determined and a pulse applied based on whether an extra read is to be performed. Otherwise, a second-pass program pulse may be applied.

For a second-pass program pulse, cells whose charge levels have already been placed in their destined distribution levels (e.g., L0-L7) may be inhibited. A program voltage may be selected and applied to the cells to produce the desired charge pulse to move the charge levels of the uninhibited cells up. The second-pass program approach may include steps 1010, 1015, and 1050.

For offsets, if an extra read is to be performed, the LP cells may be read using the threshold voltage separating the lower and upper levels and the cells read as logic 0 may be inhibited. Otherwise, all of the LP cells whose charge levels are destined for the L4 distribution level may be inhibited. If an offset is to be applied, the lower-level cells whose charge levels are destined to or already in distribution levels L0-L3 may also be inhibited. A program voltage may be calculated and applied to the cells to produce the desired offset charge pulse to move the charge levels of the uninhibited LP cells up. A cell offset approach similar to cell offset approach 800 may include steps 1025, 1040, 1045, and 1050. A cell offset approach similar to cell offset approach 900 may include steps 1030, 1035, 1040, 1045, and 1050.

After a charge pulse has been applied to the cells, the cells may be verified to make sure the pulse affected the cells' charge levels correctly. It may then be determined whether all the cells have been verified to have their charge levels be within their correct distribution levels. If so, the second pass (and the method) may be complete. Otherwise, the method may return to the start to continue with another charge pulse.

At 1005, it may be determined whether a checkpoint has been reached. The checkpoint may include, e.g., the start of a second pass, a charge level arriving at a lower level during the second pass programming (e.g., the cell arriving at level L0 or level L1 or level L2), a distribution of a lower level (e.g., L0, L1, L2, or L3) being formed, a lower level being reached during the second-pass programming, or a lower-level cell reaching a threshold. Other checkpoints may also be used. If it is determined that a checkpoint has not been reached, the method may continue to 1010 to perform a second-pass program pulse. Otherwise, the method may continue to 1020 to determine the LP cells to apply the offset to.

At 1010, cells whose charge levels have already been placed in their corresponding distribution levels (e.g., levels L0, L1, etc.) may be inhibited so a program pulse may not affect them.

At 1015, a program voltage may be selected that may provide a desired charge for the next charge pulse. The program voltage may be selected based on where the charge levels have been moved to. As discussed with reference to FIG. 5B, the voltage or current may be selected to provide an incrementally increasing charge pulses.

At 1020, it may be determined whether an extra read is to be performed on the LP cells being offset. If an extra read is not to be performed, the method may continue to 1025 to perform a charge offset of the LP cells, e.g., according to LP cell offset approach 800. Otherwise the method may continue to 1030 to perform a charge offset of the LP cells, e.g., according to LP cell offset approach 900.

At 1025, the LP cells whose charge levels may be destined for the L4 distribution level may be inhibited so a charge offset may not affect them. That way, a charge offset may apply only to LP cells destined to the L5-L7 distribution levels, e.g., according to LP cell offset approach 800.

At 1030, the cells whose charge level may be within the LP distribution level may be read using the threshold voltage between the lower and upper levels (e.g., between L3 and L4 for a TLC). The LP cells whose charge level may be at or above the threshold voltage may be read as a logic 0 and the LP cells whose charge level may be below the threshold voltage may be read as a logic 1.

At 1035, the cells that were read as a logic 0 at step 1030 may be inhibited so a charge offset will not affect them. That way, the charge offset may apply only to the LP cells whose charge levels are below the threshold voltage between the lower and upper levels, e.g., according to LP cell offset approach 900.

At 1040, the cells destined for the L0-L3 distribution levels may also be inhibited so that they may be unaffected by the charge offset. Step 1040 may be entered from 1025 or 1035, depending on which LP cells the charge offset is to be applied to.

At 1045, a program voltage may be calculated that may provide the offset charge to the uninhibited LP cells to move the cells up.

At 1050, a program pulse may be applied to the uninhibited cells to provide the program charge or the offset charge, depending on whether step 1050 was entered from step 1015 or step 1045. The program pulse may be based on the program voltage selected at 1015 or the program voltage calculated at 1045. The program pulse may move the charge levels of the uninhibited cells up toward a charge level or an offset level.

At 1055, the cells may be reviewed to verify that the charge levels of the cells were affected (or unaffected) by the program charge or the offset charge applied at 1050.

At 1060, it will be determined whether all the cells have been verified to have charge levels within their correct distribution levels. If so, the method may be complete. Otherwise, the method may return to 1005 to begin the process again with another charge pulse for the cells. The method may continue in this loop until all of the charge pulses have been applied to the cells to place the cells in their respective distribution levels.

Figure 11:
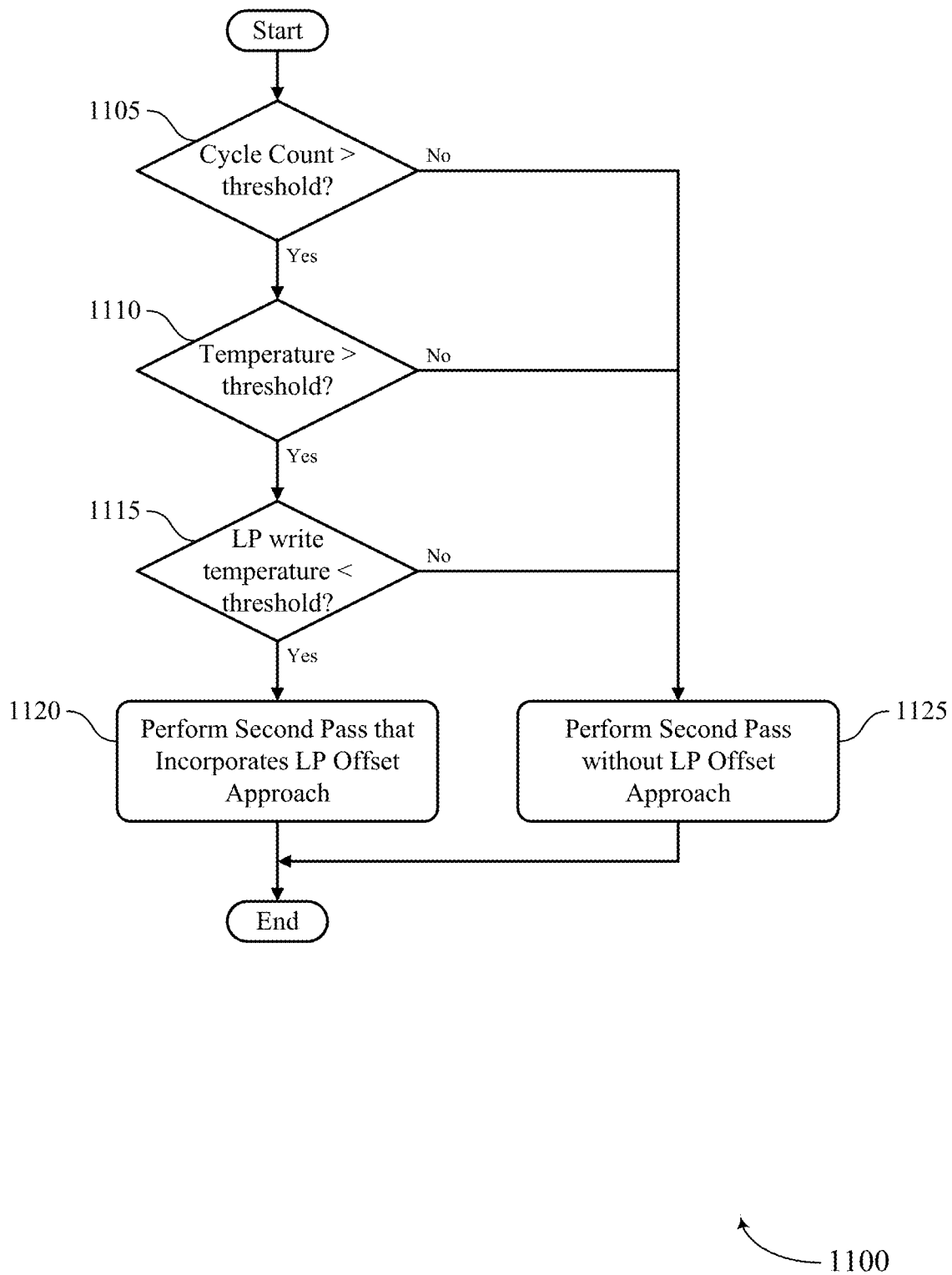
FIG. 11 shows a flowchart illustrating a method that supports programming multi-level memory cells in accordance with examples as disclosed herein.

FIG. 11 shows a flowchart illustrating a method 1100 that supports programming multi-level memory cells in accordance with examples as disclosed herein. Method 1100 may be used to determine when to use an approach that may incorporate an LP cell offset. In some examples, the method 1100 may be performed after a first pass has been performed on the multi-level memory cells.

At 1105, it may be determined whether a cycle count of the memory cells is greater than a threshold. The threshold may be near the cycle limit of the memory cells. If the cycle count is greater than the threshold, the method may continue to 1110. Otherwise, the method may continue to 1125.

At 1110, it may be determined whether a temperature of the memory device is greater than a threshold. If the memory device temperature is greater than the threshold, the method may continue to 1110. Otherwise, the method may continue to 1125.

At 1115, it may be determined whether an LP write temperature is less than a threshold. If the LP write temperature is less than the threshold, the method may continue to 1120. Otherwise, the method may continue to 1125.

At 1120, a second pass that incorporates an LP offset approach may be performed on the memory cells. In some examples, one or more of the approaches shown in FIGS. 7-10 may be used as the LP offset approach. Step 1120 may be reached if all three thresholds are exceeded in steps 1105, 1110, and 1115. In some examples, not shown, step 1120 may be reached if any of the thresholds are exceeded.

At 1125, a second pass that does not incorporate an LP offset approach may be performed on the memory cells. In some examples, this may constitute a standard second pass program. Step 1125 may be reached if any of the thresholds are not exceeded in steps 1105, 1110, and 1115. In some examples, not shown, step 1125 may be reached only if none of the thresholds are exceeded.

Figure 12:
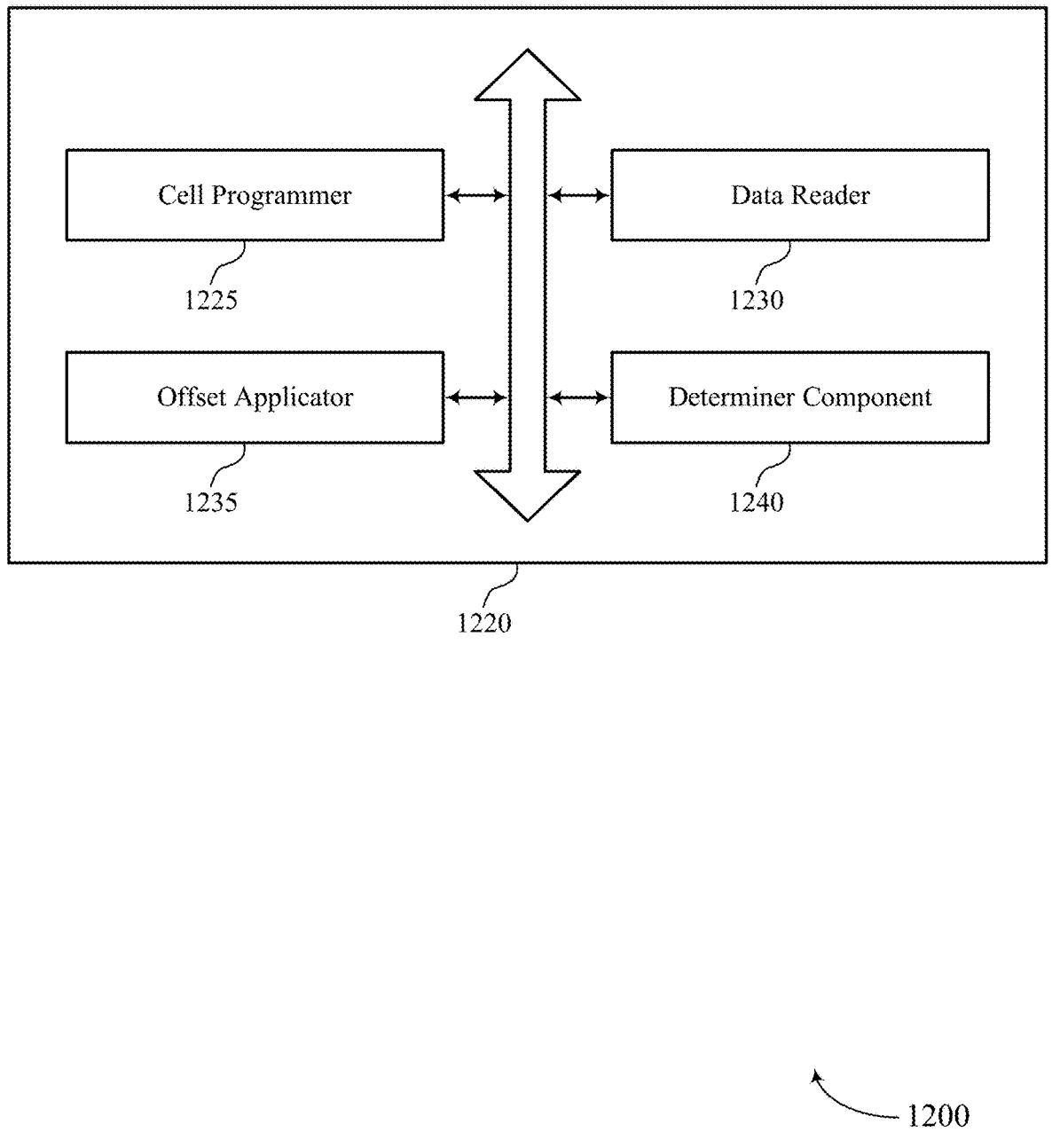
FIG. 12 shows a block diagram of a memory device that supports programming multi-level memory cells in accordance with examples as disclosed herein.

FIG. 12 shows a block diagram 1200 of a memory device 1220 that supports programming multi-level memory cells in accordance with examples as disclosed herein. The memory device 1220 may be an example of aspects of a memory device as described with reference to FIGS. 1 through 11. The memory device 1220, or various components thereof, may be an example of means for performing various aspects of programming multi-level memory cells as described herein. For example, the memory device 1220 may include a cell programmer 1225, a data reader 1230, an offset applicator 1235, a determiner component 1240, or any combination thereof. Each of these components may communicate, directly or indirectly, with one another (e.g., via one or more buses).

The cell programmer 1225 may be configured as or otherwise support a means for applying a first set of pulses selectively, according to a first set of bits, to a plurality of memory cells to program a first set of memory cells of the plurality of memory cells to a first level and a second set of memory cells of the plurality of memory cells to a second level. The data reader 1230 may be configured as or otherwise support a means for identifying a second set of bits for superposing with the first set of bits on the plurality of memory cells. In some examples, the cell programmer 1225 may be configured as or otherwise support a means for applying a second set of pulses selectively to the first set of memory cells to program the first set of memory cells to respective levels of a first set of levels based at least in part on the second set of bits. The offset applicator 1235 may be configured as or otherwise support a means for applying a third set of pulses to one or more of the second set of memory cells to provide an offset to the one or more of the second set of memory cells, where the third set of pulses is applied prior to at least one of the second set of pulses being applied. In some examples, the cell programmer 1225 may be configured as or otherwise support a means for applying a fourth set of pulses selectively to the second set of memory cells to program the second set of memory cells to respective levels of a second set of levels based at least in part on the second set of bits.

In some examples, the third set of pulses may be a single pulse.

In some examples, to support applying the third set of pulses, the offset applicator 1235 may be configured as or otherwise support a means for applying the third set of pulses prior to applying any of the second set of pulses.

In some examples, the determiner component 1240 may be configured as or otherwise support a means for determining that a checkpoint is reached during the applying of the second set of pulses, where applying the third set of pulses is based at least in part on determining that the checkpoint is reached.

In some examples, the determiner component 1240 may be configured as or otherwise support a means for a distribution of one of the first set of levels being formed. In some examples, the determiner component 1240 may be configured as or otherwise support a means for a first cell of the first set of memory cells reaching a threshold.

In some examples, to support applying the third set of pulses, the offset applicator 1235 may be configured as or otherwise support a means for applying the third set of pulses after the first set of memory cells have been programmed to a level of the first set of levels.

In some examples, to support applying the third set of pulses, the offset applicator 1235 may be configured as or otherwise support a means for applying the third set of pulses before any of the second set of memory cells have been programmed to a highest level of the first set of levels.

In some examples, to support applying the third set of pulses, the offset applicator 1235 may be configured as or otherwise support a means for applying the third set of pulses to program at least a subset of the second set of memory cells to a first level of the second set of levels.

In some examples, the data reader 1230 may be configured as or otherwise support a means for reading, after applying the first set of pulses, the second set of memory cells at a threshold voltage. In some examples, the determiner component 1240 may be configured as or otherwise support a means for determining, based at least in part on reading the second set of memory cells, a portion of the second set of memory cells that have levels corresponding to voltages that do not satisfy the threshold voltage. In some examples, the offset applicator 1235 may be configured as or otherwise support a means for applying the third set of pulses to the portion of the second set of memory cells.

In some examples, the one or more of the second set of memory cells may exclude memory cells of the second set of memory cells to be programmed to a lowest level of the second set of levels.

In some examples, a quantity of levels in each of the first and second sets of levels may be four or eight.

In some examples, a quantity of bits in the first set of bits programmed to each memory cell may be one and a quantity of bits in the second set of bits programmed to each memory cell may be two or three.

In some examples, the cell programmer 1225 may be configured as or otherwise support a means for selectively programming, according to a first set of bits, a first set of memory cells of a plurality of memory cells to a first level and a second set of memory cells of the plurality of memory cells to a second level. The determiner component 1240 may be configured as or otherwise support a means for determining whether a condition associated with the plurality of memory cells satisfies a threshold. In some examples, the offset applicator 1235 may be configured as or otherwise support a means for applying, based at least in part on determining that the condition satisfies the threshold, a voltage offset to one or more of the second set of memory cells. In some examples, the cell programmer 1225 may be configured as or otherwise support a means for programming the first set of memory cells to respective levels of a first set of levels based at least in part on a second set of bits. In some examples, the cell programmer 1225 may be configured as or otherwise support a means for programming, after applying the voltage offset to the one or more of the second set of memory cells, the second set of memory cells to respective levels of a second set of levels based at least in part on the second set of bits.

In some examples, the determiner component 1240 may be configured as or otherwise support a means for determining that a cycle count of one or more of the plurality of memory cells is greater than a cycle count threshold. In some examples, the determiner component 1240 may be configured as or otherwise support a means for determining that a temperature of one or more of the plurality of memory cells is greater than a first temperature threshold. In some examples, the determiner component 1240 may be configured as or otherwise support a means for determining that when programming the second set of memory cells to the second level, a temperature of the memory cells is less than a second temperature threshold.

In some examples, the data reader 1230 may be configured as or otherwise support a means for reading, after programming the second set of memory cells to the second level, the second set of memory cells at a threshold voltage. In some examples, the determiner component 1240 may be configured as or otherwise support a means for determining, based at least in part on reading the second set of memory cells, a portion of the second set of memory cells that have levels corresponding to voltages that do not satisfy the threshold voltage.

In some examples, to support applying the voltage offset to the one or more of the second set of memory cells, the offset applicator 1235 may be configured as or otherwise support a means for applying the voltage offset to the portion of the second set of memory cells.

In some examples, to support applying the voltage offset to the one or more of the second set of memory cells, the offset applicator 1235 may be configured as or otherwise support a means for applying the voltage offset after the first set of memory cells have been programmed to a level of the first set of levels.

In some examples, to support applying the voltage offset to the one or more of the second set of memory cells, the offset applicator 1235 may be configured as or otherwise support a means for applying the voltage offset to the one or more of the second set of memory cells prior to any of the first set of memory cells being programmed to a highest level of the first set of levels.

In some examples, to support applying the voltage offset to the one or more of the second set of memory cells, the offset applicator 1235 may be configured as or otherwise support a means for applying the voltage offset to the one or more of the second set of memory cells after the beginning of and prior to completion of the programming of the first set of memory cells to the respective levels of the first set of levels.

Figure 13:
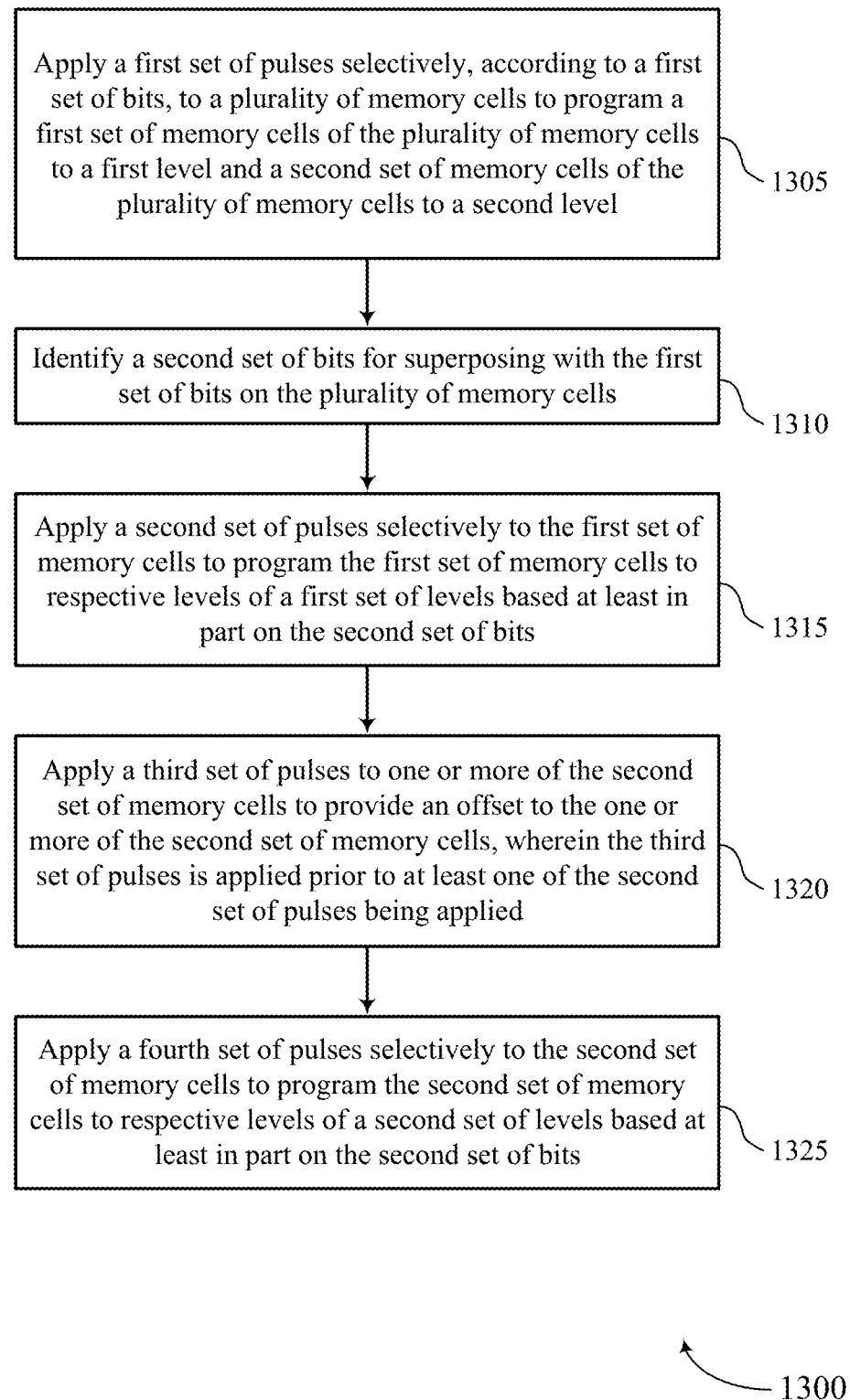
FIGS. 13 and 14 show flowcharts illustrating methods that support programming multi-level memory cells in accordance with examples as disclosed herein.

FIG. 13 shows a flowchart illustrating a method 1300 that supports programming multi-level memory cells in accordance with examples as disclosed herein. The operations of method 1300 may be implemented by a memory device or its components as described herein. For example, the operations of method 1300 may be performed by a memory device as described with reference to FIGS. 1 through 12. In some examples, a memory device may execute a set of instructions to control the functional elements of the device to perform the described functions. Additionally or alternatively, the memory device may perform aspects of the described functions using special-purpose hardware.

At 1305, the method may include applying a first set of pulses selectively, according to a first set of bits, to a plurality of memory cells to program a first set of memory cells of the plurality of memory cells to a first level and a second set of memory cells of the plurality of memory cells to a second level. The operations of 1305 may be performed in accordance with examples as disclosed herein. In some examples, aspects of the operations of 1305 may be performed by a cell programmer 1225 as described with reference to FIG. 12.

At 1310, the method may include identifying a second set of bits for superposing with the first set of bits on the plurality of memory cells. The operations of 1310 may be performed in accordance with examples as disclosed herein. In some examples, aspects of the operations of 1310 may be performed by a data reader 1230 as described with reference to FIG. 12.

At 1315, the method may include applying a second set of pulses selectively to the first set of memory cells to program the first set of memory cells to respective levels of a first set of levels based at least in part on the second set of bits. The operations of 1315 may be performed in accordance with examples as disclosed herein. In some examples, aspects of the operations of 1315 may be performed by a cell programmer 1225 as described with reference to FIG. 12.

At 1320, the method may include applying a third set of pulses to one or more of the second set of memory cells to provide an offset to the one or more of the second set of memory cells, where the third set of pulses is applied prior to at least one of the second set of pulses being applied. The operations of 1320 may be performed in accordance with examples as disclosed herein. In some examples, aspects of the operations of 1320 may be performed by an offset applicator 1235 as described with reference to FIG. 12.

At 1325, the method may include applying a fourth set of pulses selectively to the second set of memory cells to program the second set of memory cells to respective levels of a second set of levels based at least in part on the second set of bits. The operations of 1325 may be performed in accordance with examples as disclosed herein. In some examples, aspects of the operations of 1325 may be performed by a cell programmer 1225 as described with reference to FIG. 12.

In some examples, an apparatus as described herein may perform a method or methods, such as the method 1300. The apparatus may include, features, circuitry, logic, means, or instructions (e.g., a non-transitory computer-readable medium storing instructions executable by a processor) for applying a first set of pulses selectively, according to a first set of bits, to a plurality of memory cells to program a first set of memory cells of the plurality of memory cells to a first level and a second set of memory cells of the plurality of memory cells to a second level, identifying a second set of bits for superposing with the first set of bits on the plurality of memory cells, applying a second set of pulses selectively to the first set of memory cells to program the first set of memory cells to respective levels of a first set of levels based at least in part on the second set of bits, applying a third set of pulses to one or more of the second set of memory cells to provide an offset to the one or more of the second set of memory cells, where the third set of pulses is applied prior to at least one of the second set of pulses being applied, and applying a fourth set of pulses selectively to the second set of memory cells to program the second set of memory cells to respective levels of a second set of levels based at least in part on the second set of bits.

In some examples of the method 1300 and the apparatus described herein, the third set of pulses may be a single pulse.

In some examples of the method 1300 and the apparatus described herein, applying the third set of pulses may include operations, features, circuitry, logic, means, or instructions for applying the third set of pulses prior to applying any of the second set of pulses.

Some examples of the method 1300 and the apparatus described herein may further include operations, features, circuitry, logic, means, or instructions for determining that a checkpoint may be reached during the applying of the second set of pulses, where applying the third set of pulses may be based at least in part on determining that the checkpoint may be reached.

In some examples of the method 1300 and the apparatus described herein, and the method, apparatuses, and non-transitory computer-readable medium may include further operations, features, circuitry, logic, means, or instructions for a distribution of one of the first set of levels being formed and a first cell of the first set of memory cells reaching a threshold.

In some examples of the method 1300 and the apparatus described herein, applying the third set of pulses may include operations, features, circuitry, logic, means, or instructions for applying the third set of pulses after the first set of memory cells may have been programmed to a level of the first set of levels.

In some examples of the method 1300 and the apparatus described herein, applying the third set of pulses may include operations, features, circuitry, logic, means, or instructions for applying the third set of pulses before any of the second set of memory cells may have been programmed to a highest level of the first set of levels.

In some examples of the method 1300 and the apparatus described herein, applying the third set of pulses may include operations, features, circuitry, logic, means, or instructions for applying the third set of pulses to program at least a subset of the second set of memory cells to a first level of the second set of levels.

In some examples of the method 1300 and the apparatus described herein, reading, after applying the first set of pulses, the second set of memory cells at a threshold voltage, determining, based at least in part on reading the second set of memory cells, a portion of the second set of memory cells that may have levels corresponding to voltages that do not satisfy the threshold voltage, and applying the third set of pulses to the portion of the second set of memory cells.

In some examples of the method 1300 and the apparatus described herein, the one or more of the second set of memory cells exclude memory cells of the second set of memory cells to be programmed to a lowest level of the second set of levels.

In some examples of the method 1300 and the apparatus described herein, a quantity of levels in each of the first and second sets of levels may be four or eight.

In some examples of the method 1300 and the apparatus described herein, a quantity of bits in the first set of bits programmed to each memory cell may be one and a quantity of bits in the second set of bits programmed to each memory cell may be two or three.

Figure 14:
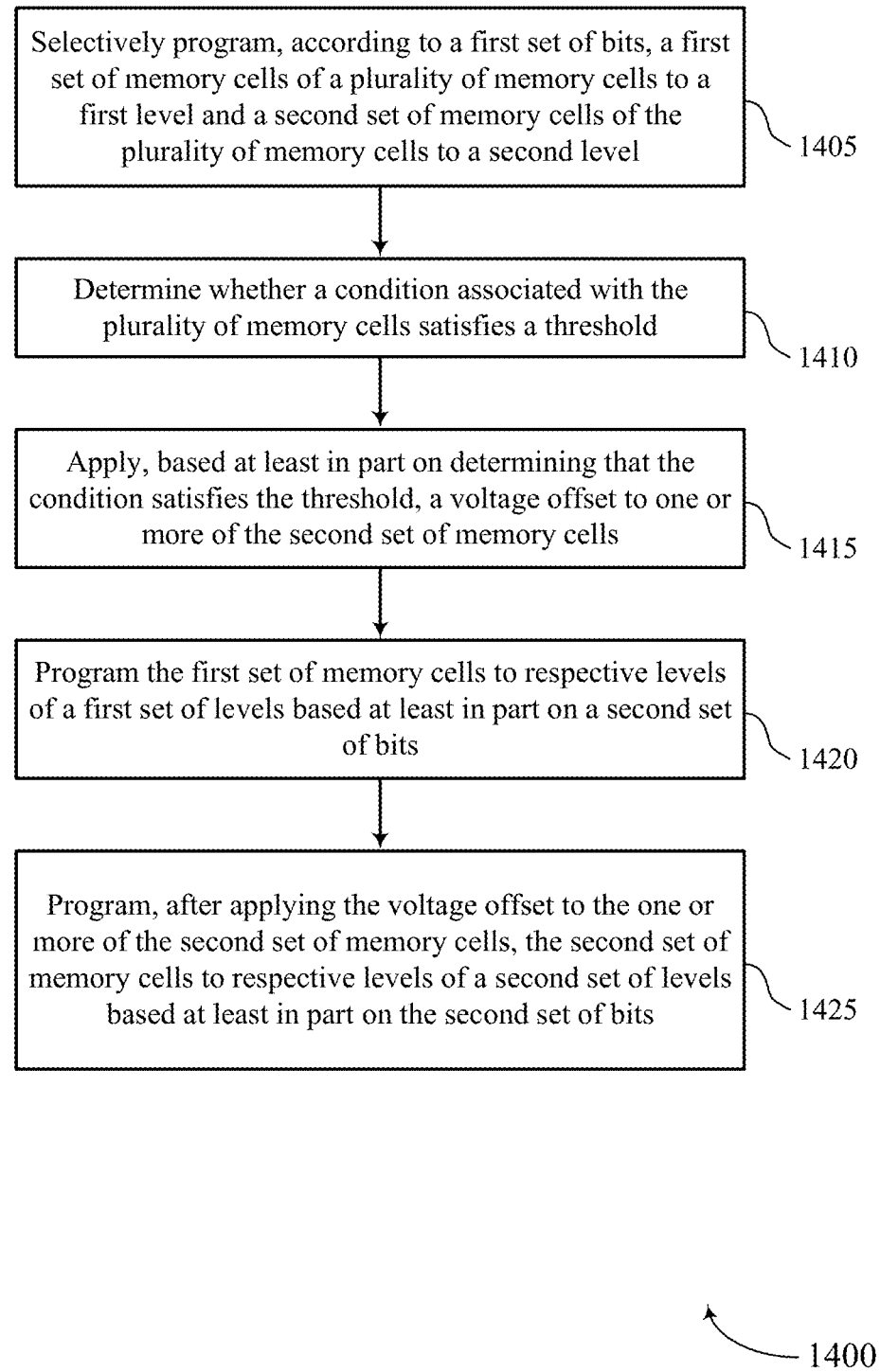

FIG. 14 shows a flowchart illustrating a method 1400 that supports programming multi-level memory cells in accordance with examples as disclosed herein. The operations of method 1400 may be implemented by a memory device or its components as described herein. For example, the operations of method 1400 may be performed by a memory device as described with reference to FIGS. 1 through 12. In some examples, a memory device may execute a set of instructions to control the functional elements of the device to perform the described functions. Additionally or alternatively, the memory device may perform aspects of the described functions using special-purpose hardware.

At 1405, the method may include selectively programming, according to a first set of bits, a first set of memory cells of a plurality of memory cells to a first level and a second set of memory cells of the plurality of memory cells to a second level. The operations of 1405 may be performed in accordance with examples as disclosed herein. In some examples, aspects of the operations of 1405 may be performed by a cell programmer 1225 as described with reference to FIG. 12.

At 1410, the method may include determining whether a condition associated with the plurality of memory cells satisfies a threshold. The operations of 1410 may be performed in accordance with examples as disclosed herein. In some examples, aspects of the operations of 1410 may be performed by a determiner component 1240 as described with reference to FIG. 12.

At 1415, the method may include applying, based at least in part on determining that the condition satisfies the threshold, a voltage offset to one or more of the second set of memory cells. The operations of 1415 may be performed in accordance with examples as disclosed herein. In some examples, aspects of the operations of 1415 may be performed by an offset applicator 1235 as described with reference to FIG. 12.

At 1420, the method may include programming the first set of memory cells to respective levels of a first set of levels based at least in part on a second set of bits. The operations of 1420 may be performed in accordance with examples as disclosed herein. In some examples, aspects of the operations of 1420 may be performed by a cell programmer 1225 as described with reference to FIG. 12.

At 1425, the method may include programming, after applying the voltage offset to the one or more of the second set of memory cells, the second set of memory cells to respective levels of a second set of levels based at least in part on the second set of bits. The operations of 1425 may be performed in accordance with examples as disclosed herein. In some examples, aspects of the operations of 1425 may be performed by a cell programmer 1225 as described with reference to FIG. 12.

In some examples, an apparatus as described herein may perform a method or methods, such as the method 1400. The apparatus may include, features, circuitry, logic, means, or instructions (e.g., a non-transitory computer-readable medium storing instructions executable by a processor) for selectively programming, according to a first set of bits, a first set of memory cells of a plurality of memory cells to a first level and a second set of memory cells of the plurality of memory cells to a second level—determining whether a condition associated with the plurality of memory cells satisfies a threshold, applying, based at least in part on determining that the condition satisfies the threshold, a voltage offset to one or more of the second set of memory cells, programming the first set of memory cells to respective levels of a first set of levels based at least in part on a second set of bits, and programming, after applying the voltage offset to the one or more of the second set of memory cells, the second set of memory cells to respective levels of a second set of levels based at least in part on the second set of bits.

In some examples of the method 1400 and the apparatus described herein, and the method, apparatuses, and non-transitory computer-readable medium may include further operations, features, circuitry, logic, means, or instructions for determining that a cycle count of one or more of the plurality of memory cells may be greater than a cycle count threshold, determining that a temperature of one or more of the plurality of memory cells may be greater than a first temperature threshold, and determining that when programming the second set of memory cells to the second level, a temperature of the memory cells may be less than a second temperature threshold.

In some examples of the method 1400 and the apparatus described herein, reading, after programming the second set of memory cells to the second level, the second set of memory cells at a threshold voltage and determining, based at least in part on reading the second set of memory cells, a portion of the second set of memory cells that may have levels corresponding to voltages that do not satisfy the threshold voltage.

In some examples of the method 1400 and the apparatus described herein, applying the voltage offset to the one or more of the second set of memory cells may include operations, features, circuitry, logic, means, or instructions for applying the voltage offset to the portion of the second set of memory cells.

In some examples of the method 1400 and the apparatus described herein, applying the voltage offset to the one or more of the second set of memory cells may include operations, features, circuitry, logic, means, or instructions for applying the voltage offset after the first set of memory cells may have been programmed to a level of the first set of levels.

In some examples of the method 1400 and the apparatus described herein, applying the voltage offset to the one or more of the second set of memory cells may include operations, features, circuitry, logic, means, or instructions for applying the voltage offset to the one or more of the second set of memory cells prior to any of the first set of memory cells being programmed to a highest level of the first set of levels.

In some examples of the method 1400 and the apparatus described herein, applying the voltage offset to the one or more of the second set of memory cells may include operations, features, circuitry, logic, means, or instructions for applying the voltage offset to the one or more of the second set of memory cells after the beginning of and prior to completion of the programming of the first set of memory cells to the respective levels of the first set of levels.

It should be noted that the methods described above describe possible implementations, and that the operations and the steps may be rearranged or otherwise modified and that other implementations are possible. Further, portions from two or more of the methods may be combined.

Another apparatus is described. The apparatus may include a memory array and a controller coupled with the memory array and configured to cause the apparatus to apply a first set of pulses selectively, according to a first set of bits, to a plurality of memory cells to program a first set of memory cells of the plurality of memory cells to a first level and a second set of memory cells of the plurality of memory cells to a second level, identify a second set of bits for superposing with the first set of bits on the plurality of memory cells, apply a second set of pulses selectively to the first set of memory cells to program the first set of memory cells to respective levels of a first set of levels based at least in part on the second set of bits, apply a third set of pulses to one or more of the second set of memory cells to provide an offset to the one or more of the second set of memory cells, where the third set of pulses is applied prior to at least one of the second set of pulses being applied, and apply a fourth set of pulses selectively to the second set of memory cells to program the second set of memory cells to respective levels of a second set of levels based at least in part on the second set of bits, where the third set of pulses is applied prior to at least one of the second set of pulses being applied In some examples of the apparatus, applying the third set of pulses may include applying the third set of pulses after the first set of memory cells may have been programmed to a level of the first set of levels.

In some examples of the apparatus, applying the third set of pulses may include applying the third set of pulses before any of the first set of memory cells may have been programmed to a highest level of the first set of levels.

In some examples of the apparatus, the controller may be further configured to cause the apparatus to read, after applying the first set of pulses, the second set of memory cells at a threshold voltage, determine, based at least in part on reading the second set of memory cells, a portion of the second set of memory cells that may have voltages above the threshold voltage, and apply the third set of pulses to the portion of the second set of memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the terms "electronic communication," "conductive contact," "connected," and "coupled" may refer to a relationship between components that supports the flow of signals between the components. Components are considered in electronic communication with (or in conductive contact with or connected with or coupled with) one another if there is a conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

As used herein, the term "coupling" refers to a condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be one or more instructions or code stored on or transmitted over a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. An apparatus comprising:
a memory array; and
a controller coupled with the memory array and configured to cause the apparatus to:

apply a first set of pulses selectively, according to a first set of bits, to a plurality of memory cells to program a first set of memory cells of the plurality of memory cells to a first level and a second set of memory cells of the plurality of memory cells to a second level;

identify a second set of bits for superposing with the first set of bits on the plurality of memory cells;

apply a second set of pulses selectively to the first set of memory cells to program the first set of memory cells to respective levels of a first set of levels based at least in part on the second set of bits;

apply a third set of pulses to one or more of the second set of memory cells to provide an offset to the one or more of the second set of memory cells, wherein the third set of pulses is applied prior to at least one of the second set of pulses being applied; and apply a fourth set of pulses selectively to the second set of memory cells to program the second set of memory cells to respective levels of a second set of levels based at least in part on the second set of bits.

2. The apparatus of claim 1, wherein the third set of pulses is a single pulse.

3. The apparatus of claim 1, wherein the controller is further configured to cause the apparatus to apply the third set of pulses prior to applying any of the second set of pulses.

4. The apparatus of claim 1, wherein the controller is further configured to cause the apparatus to:
determine that a checkpoint is reached during the applying of the second set of pulses, wherein the controller is configured to cause the apparatus to apply the third set of pulses based at least in part on determining that the checkpoint is reached.

5. The apparatus of claim 4, wherein the checkpoint comprises one or more of:
a distribution of one of the first set of levels being formed; or
a first cell of the first set of memory cells reaching a threshold.

6. The apparatus of claim 5, wherein the controller is further configured to cause the apparatus to apply the third set of pulses after the first set of memory cells have been programmed to a level of the first set of levels.

7. The apparatus of claim 1, wherein the controller is further configured to cause the apparatus to apply the third set of pulses before any of the second set of memory cells have been programmed to a highest level of the first set of levels.

8. The apparatus of claim 1, wherein the controller is further configured to cause the apparatus to apply the third set of pulses to program at least a subset of the second set of memory cells to a first level of the second set of levels.

9. The apparatus of claim 1, wherein the controller is further configured to cause the apparatus to:
read, after applying the first set of pulses, the second set of memory cells at a threshold voltage;
determine, based at least in part on reading the second set of memory cells, a portion of the second set of memory cells that have levels corresponding to voltages that do not satisfy the threshold voltage; and
apply the third set of pulses to the portion of the second set of memory cells.

10. The apparatus of claim 1, wherein the one or more of the second set of memory cells exclude memory cells of the second set of memory cells to be programmed to a lowest level of the second set of levels.

11. The apparatus of claim 1, wherein a quantity of levels in each of the first and second sets of levels are four or eight.

12. The apparatus of claim 1, wherein a quantity of bits in the first set of bits programmed to each memory cell is one and a quantity of bits in the second set of bits programmed to each memory cell is two or three.

13. An apparatus, comprising:
a memory array; and
a controller coupled with the memory array and configured to cause the apparatus to:
selectively program, according to a first set of bits, a first set of memory cells of a plurality of memory cells to a first level and a second set of memory cells of the plurality of memory cells to a second level;
determine whether a condition associated with the plurality of memory cells satisfies a threshold;
apply, based at least in part on determining that the condition satisfies the threshold, a voltage offset to one or more of the second set of memory cells;
program the first set of memory cells to respective levels of a first set of levels based at least in part on a second set of bits; and
program, after applying the voltage offset to the one or more of the second set of memory cells, the second set of memory cells to respective levels of a second set of levels based at least in part on the second set of bits.

14. The apparatus of claim 13, wherein determining that the condition exceeds the threshold comprises the controller configured to cause the apparatus to perform one or more of:
determine that a cycle count of one or more of the plurality of memory cells is greater than a cycle count threshold; or
determine that a temperature of one or more of the plurality of memory cells is greater than a first temperature threshold; or
determine that when programming the second set of memory cells to the second level, the temperature of the second set of memory cells is less than a second temperature threshold.

15. The apparatus of claim 13, wherein the controller is further configured to cause the apparatus to:
read, after programming the second set of memory cells to the second level, the second set of memory cells at a threshold voltage; and
determine, based at least in part on reading the second set of memory cells, a portion of the second set of memory cells that have levels corresponding to voltages that do not satisfy the threshold voltage,
wherein applying the voltage offset to the one or more of the second set of memory cells comprises the controller configured to cause the apparatus to apply the voltage offset to the portion of the second set of memory cells.

16. The apparatus of claim 13, wherein the controller is further configured to cause the apparatus to apply the voltage offset to the one or more of the second set of memory cells after the first set of memory cells have been programmed to a level of the first set of levels.

17. The apparatus of claim 13, wherein the controller is further configured to cause the apparatus to apply the voltage offset to the one or more of the second set of memory cells prior to any of the first set of memory cells being programmed to a highest level of the first set of levels.

18. The apparatus of claim 13, wherein the controller is further configured to cause the apparatus to apply the voltage offset to the one or more of the second set of memory cells after the beginning of and prior to completion of the programming of the first set of memory cells to the respective levels of the first set of levels.

19. A non-transitory computer-readable medium storing code comprising instructions which, when executed by a processor of an electronic device, cause the electronic device to:
- apply a first set of pulses selectively, according to a first set of bits, to a plurality of memory cells to program a first set of memory cells of the plurality of memory cells to a first level and a second set of memory cells of the plurality of memory cells to a second level;
- identify a second set of bits for superposing with the first set of bits on the plurality of memory cells;
- apply a second set of pulses selectively to the first set of memory cells to program the first set of memory cells to respective levels of a first set of levels based at least in part on the second set of bits;
- apply a third set of pulses to one or more of the second set of memory cells to provide an offset to the one or more of the second set of memory cells, wherein the third set of pulses is applied prior to at least one of the second set of pulses being applied; and
- apply a fourth set of pulses selectively to the second set of memory cells to program the second set of memory cells to respective levels of a second set of levels based at least in part on the second set of bits, wherein the third set of pulses is applied prior to at least one of the second set of pulses being applied.

20. The non-transitory computer-readable medium of claim 19, wherein the instructions, when executed by the processor of the electronic device, cause the electronic device to apply the third set of pulses after the first set of memory cells have been programmed to a level of the first set of levels.

21. The non-transitory computer-readable medium of claim 19, wherein the instructions, when executed by the processor of the electronic device, cause the electronic device to apply the third set of pulses before any of the first set of memory cells have been programmed to a highest level of the first set of levels.

22. The non-transitory computer-readable medium of claim 19, wherein the instructions, when executed by the processor of the electronic device, further cause the electronic device to:
- read, after applying the first set of pulses, the second set of memory cells at a threshold voltage;
- determine, based at least in part on reading the second set of memory cells, a portion of the second set of memory cells that have voltages above the threshold voltage; and
- apply the third set of pulses to the portion of the second set of memory cells.

* * * * *